(12) United States Patent
Nakagawa et al.

(10) Patent No.: US 6,411,078 B1
(45) Date of Patent: Jun. 25, 2002

(54) CURRENT SENSOR APPARATUS

(75) Inventors: Shiro Nakagawa; Kazuyuki Itoh; Katsuaki Tanaka; Katsumi Yabusaki, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/487,802

(22) Filed: Jan. 20, 2000

Related U.S. Application Data

(63) Continuation of application No. PCT/JP99/03587, filed on Jul. 2, 1999.

(30) Foreign Application Priority Data

Jan. 21, 1999 (JP) ............................................ 11-012584
Apr. 21, 1999 (JP) ........................................... 11-113240

(51) Int. Cl.$^7$ ............................................. G01R 33/00
(52) U.S. Cl. ................................................. 324/117 H
(58) Field of Search ......................... 324/117 H, 117 R, 324/127, 244, 251, 253

(56) References Cited

U.S. PATENT DOCUMENTS

| | | | |
|---|---|---|---|
| 4,503,395 A | 3/1985 | Kratzer et al. | |
| 4,961,049 A | 10/1990 | Ghislanzoni | |
| 5,146,156 A | * 9/1992 | Marcel | 324/157 |

FOREIGN PATENT DOCUMENTS

| | | |
|---|---|---|
| JP | U 48-98185 | 11/1973 |
| JP | A-60-185179 | 9/1985 |
| JP | B2-62-55111 | 11/1987 |
| JP | B2-63-52712 | 10/1988 |
| JP | A-1-265168 | 10/1989 |
| JP | A-4-93772 | 3/1992 |
| JP | A 4-155266 | 5/1992 |
| JP | A-5-52872 | 3/1993 |
| JP | A-5-99953 | 4/1993 |
| JP | U 5-81731 | 11/1993 |
| JP | Y2-7-23751 | 5/1995 |
| JP | A-7-218552 | 8/1995 |
| JP | A-8-15322 | 1/1996 |
| JP | A 8-62254 | 3/1996 |
| JP | A-9-61506 | 3/1997 |
| JP | A-9-257835 | 10/1997 |
| JP | A-10-26639 | 1/1998 |

* cited by examiner

Primary Examiner—N. Le
Assistant Examiner—Etienne P LeRoux
(74) Attorney, Agent, or Firm—Oliff & Berridge, PLC

(57) ABSTRACT

It is an object of the invention to provide a current sensor apparatus that reduces measurement errors resulting from variations in a position of a current path passing through the space inside a magnetic yoke. The current sensor apparatus comprises a ring-shaped magnetic yoke (2) surrounding a current path (1), part of the yoke having a gap (3), and a magnetic sensor element (4) placed in the gap (3) of the magnetic yoke (2). The magnetic sensor element (4) detects a magnetic field in the gap (3) generated by a current flowing through the current path (1) to measure the current flowing through the current path (1). The current sensor apparatus further comprises a magnetic field interrupter (5), placed between the current path (1) and the gap (3), for interrupting a magnetic field corresponding to a magnetic flux generated by the current passing through the current path (1) and not passing through the magnetic yoke (2), so that the magnetic field would not reach the magnetic sensor element (4).

27 Claims, 12 Drawing Sheets

CURRENT SENSOR APPARATUS

This is a Continuation of PCT/JP99/03587 filed Jul. 2, 1999. The entire disclosure of the prior application is hereby incorporated by reference herein in its entirety.

TECHNICAL FIELD

The present invention relates to a current sensor apparatus used for non-contact measurement of a relatively large electric current.

BACKGROUND ART

Many types of magnetic sensor apparatuses and non-contact-type electric current sensor apparatuses utilizing magnetic sensor apparatuses have been long developed since such apparatuses are useful in industry. However, their application fields have been limited and the market scale have been thus limited. Consequently, development of such apparatuses in terms of cost reduction have not been fully achieved yet.

However, emission control originating from the need for solving environmental problems has accelerated development of electric automobiles and solar-electric power generation. Since a direct current of several kilowatts to tens of kilowatts is dealt with in an electric car or solar-electric power generation, a non-contact current sensor apparatus is required for measuring a direct current of tens to hundreds of amperes. The demand for such current sensor apparatuses is extremely high. It is therefore difficult to increase the popularity of electric automobiles and solar-electric power generation unless the current sensor apparatuses not only exhibit excellent properties but also are extremely low-priced. In addition, reliability is required for a period of time as long as 10 years or more for a current sensor apparatus used in a harsh environment as in an electric car. As thus described, it has been requested in society to provide current sensor apparatuses that are inexpensive and have excellent properties and long-term reliability.

For non-contact measurement of an electric current, an alternating current component is easily measured through the use of the principle of a transformer. However, it is impossible to measure a direct current component through this method. Therefore, a method is taken to measure a magnetic field generated by a current through a magnetic sensor for measuring a direct current component. A Hall element is widely used for such a magnetic sensor. A magnetoresistive element and a fluxgate element are used in some applications, too.

For example, the following problems have been found in the current sensor apparatus utilizing a Hall element that has been most highly developed in prior art.

(1) low sensitivity
(2) inconsistent sensitivity
(3) poor thermal characteristic
(4) offset voltage that requires troublesome handling In addition to the above problems, a magnetoresistive element has a problem of poor linearity.

In Published Unexamined Japanese Patent Application Hei 7-218552 (1995), a technique is disclosed for increasing a current measurement range of a current sensor apparatus incorporating a Hall element by forming two gaps having different lengths at separated ends of a ring-shaped core member and placing a Hall element in each of the gaps.

An example of a current sensor apparatus incorporating a magnetoresistive element is disclosed in Unexamined Japanese Patent Application Hei 10-26639 (1998).

Some methods have been developed for solving the problems of a Hall element. One of the methods is a so-called negative feedback method, that is, to apply a reversed magnetic field proportional to an output of the element to the element so as to apply negative feedback such that the output of the element is maintained constant. Consistency in sensitivity, the thermal characteristic, and linearity are thereby improved.

When the negative feedback method is used, however, it is required to apply an inverse magnetic field as large as the field to be measured to the element. Consequently, when a current as high as hundreds of amperes is measured in applications such as an electric car or solar-electric power generation, a feedback current obtained is several amperes even if the number of turns of the coil for generating a feedback field is 100. Therefore, a current sensor apparatus embodied through this method is very large-sized and expensive.

If the magnetic sensor element has high sensitivity, it is possible that a feedback current is reduced by applying only part (such as one hundredth) of the field to be measured to the element. However, this is difficult for a Hall element with low sensitivity used as the magnetic sensor element.

A fluxgate element has been developed mainly for measurement of a small magnetic field while not many developments have been made in techniques for measuring a large current. However, with some modification a fluxgate element may be used as a magnetic detection unit of a current sensor apparatus for a large current since the fluxgate element has a simple configuration and high sensitivity.

Reference is now made to FIG. 17 to describe the operation principle of a fluxgate element having the simplest configuration. FIG. 17 is a plot for showing the relationship between an inductance of a coil wound around a magnetic core and a coil current. Since the core has a magnetic saturation property, the effective permeability of the core is reduced and the inductance of the coil is reduced if the coil current increases. Therefore, if bias magnetic field B is applied to the core by a magnet and the like, the magnitude of external magnetic field $H_o$ is measured as a change in inductance of the coil when external field $H_o$ is superposed on the bias field. This is the operation principle of the simplest fluxgate element. In FIG. 17 each of bias field B and external field $H_o$ is expressed in the magnitude converted to the coil current.

In this method the position of bias point B changes with factors such as the intensity of the magnetic field generated by the magnet or the positions of the magnet and the core in relation to each other. It is therefore required to maintain the inductance at a specific value when the external magnetic field is zero. However, it is extremely difficult to compensate the instability of the inductance value due to temperature changes and other external perturbations. This method is therefore not suitable for practical applications.

If a rod-shaped magnetic core is used, an open magnetic circuit is provided, so that the effect of hysteresis is generally very small. Assuming that the hysteresis of the core is negligible, the characteristic of variations in inductance is equal when the coil current flows in the positive direction and in the negative direction since the saturation characteristic of the core is independent of the direction of coil current. For example, in FIG. 17 it is assumed that point $P_+$ and point $P_-$ represent the coil current in the positive direction and the coil current of the negative direction, respectively, whose absolute values are equal to each other. In the neighborhood of these points, the characteristic of variations in inductance with respect to variations in the absolute value of the coil current is equal. Therefore, an alternating current may be applied to the coil such that the core is driven into a saturation region at a peak, and the difference in the amount of decrease in inductance may be measured when positive and negative peak values of the current are obtained. As a result, the difference thus measured is constantly zero when the external magnetic field is zero, which is always the case even when the characteristics of the core change due to temperature changes or external perturbations. In the present patent application a saturation region of the magnetic core means a region where an absolute value of the magnetic field is greater than the absolute value of the magnetic field when the permeability of the core is maximum.

An external magnetic field is assumed to be applied to the core. If external field $H_o$ is applied in the positive direction of the current, as shown in FIG. 17, the inductance value decreases at the positive peak of the current (point $Q_+$ in FIG. 17, for example) and the inductance value increases at the negative peak of the current (point $Q_-$ in FIG. 17, for example). Therefore, the difference between the values is other than zero. Since the difference in inductance depends on the external magnetic field, the external field is obtained by measuring the difference in inductance.

The method thus described is called a large amplitude excitation method in the present patent application, that is, to apply an alternating current to the coil such that the core is driven into a saturation region at a peak, and to measure the difference in the amounts of decrease in inductance when positive and negative peak values of the current are obtained.

Magnetic sensor apparatuses that utilize such a large amplitude excitation method are disclosed in Published Examined Japanese Patent Application Sho 62-55111 (1987), Published Examined Japanese Patent Application Sho 63-52712 (1988), and Published Unexamined Japanese Patent Application Hei 9-61506 (1997), for example. In Published Examined Japanese Utility Model Application Hei 7-23751 (1995), a technique is disclosed to achieve measurement similar to the large amplitude excitation method through the use of two bias magnets.

The large amplitude excitation method is an excellent method since the effects of temperature changes and external perturbations are eliminated. However, it is not so easy to apply an alternating current enough to drive the core into saturation. Accordingly, in prior art the large amplitude excitation method is limited to a magnetic sensor apparatus for detecting a small magnetic field through the use of an amorphous magnetic core and the like having a small saturation field.

For non-contact measurement of a direct current, a method is generally taken to detect a magnetic field generated by a current through the use of a magnetic sensor element. In this method, for example, a magnetic yoke having a gap is provided around a current path, and a magnetic sensor element is placed in the gap. The magnetic field in the gap is measured by the sensor element. Intensity H of the field in the gap is I/g where the current value is I and the gap length is g. Current I is thus obtained by measuring magnetic field H with a magnetic sensor element.

The use of a fluxgate element as a magnetic sensor element will now be considered. A fluxgate element has a feature that the length in the direction in which a magnetic field is applied is relatively long. Therefore, gap length 'g' is relatively long. A shortest length of an actual fluxgate element in the direction in which a magnetic field is applied is about 1 to 5 mm. In addition, a long gap length is acceptable since a fluxgate element has a high sensitivity so that an extremely large magnetic field is not necessary. Accordingly, the gap length of the magnetic yoke of a current sensor apparatus incorporating a fluxgate element is longer than that of a sensor apparatus incorporating any other type of magnetic sensor element such as a Hall element. In an actual design, the gap length of a 100A-level current sensor apparatus is 5 to 10 mm.

This indicates that, if the position of the current path surrounded by the magnetic yoke is close to the gap, the magnetic field inside the gap varies with the magnetic field corresponding to the magnetic flux generated from the current path and not passing through the yoke. Since the magnetic field at a distance of radius 'r' from the current path is I/2πr, the magnetic field corresponding to the flux not passing through the yoke is greater than the field corresponding to the flux passing through the yoke where r<g/2π. As thus described, it is noted that a variation in the position of the current path is one of the greatest factors causing measurement errors for a fluxgate element although such a variation in the current path position will not cause any problem if gap length 'g' is 1 to 2 mm as in a Hall element.

To avoid the above-stated problem, a method may be taken to fix the current path or to use a large magnetic yoke and increase the distance between the current path and the gap. However, the method of fixing the current path sacrifices the convenience of the apparatus in that a current is measured by simply passing an electric wire through the space inside the magnetic yoke. The method of using a large magnetic yoke has a problem that the sensor apparatus is increased in size and weight.

Since not many researches have been made on current sensor apparatuses incorporating a fluxgate element, no prior-art example is found in the method of reducing measurement errors resulting from variations in the position of the current path. However, a current sensor apparatus incorporating a fluxgate element has many features such as reliability better than those of current sensor apparatuses using other magnetic sensor elements. It is therefore very useful in industry to reduce measurement errors resulting from variations in the position of the current path, the only drawback of the appartus using a fluxgate element.

In Published Unexamined Japanese Patent Application Hei 5-99953 (1993), a technique is disclosed for reducing errors in a detected current value caused by an electric wire passing outside a magnetic yoke. However, no consideration is given to errors caused by variations in the position of an electric wire passing through the space inside the yoke. In Published Unexamined Japanese Patent Application Hei 8-15322 (1996), a technique is disclosed for reducing magnetic effects on a magnetic detection element of a magnetic field generated from a conductor to be measured or other external magnetic fields. In this technique a magnetic core is divided into a ring-shaped core on which no feedback winding is placed and an H-shaped core on which a feedback winding is placed. The H-shaped core detects a leakage flux in a gap of the ring-shaped core. The H-shaped core together with the magnetic detection element placed near the H-shaped core is covered with a magnetic shield member. However, this technique has a problem that the configuration is complicated and the current sensor apparatus is large-sized.

The large amplitude excitation method is an excellent method since the effects of temperature changes and external perturbations are eliminated. If the large amplitude excitation method is applied together with the negative feedback method, excellent properties will be expected, according to the principle. Examples in which the negative feedback method is applied to a magnetic sensor apparatus incorporating a fluxgate element are disclosed in Published Unexamined Japanese Patent Application Sho 60-185179 (1985) and Published Unexamined Japanese Patent Application Hei 9-257835 (1997).

However, a fluxgate current sensor apparatus incorporating a fluxgate element involves the following drawback resulting from the measurement principle thereof. Since the fluxgate current sensor apparatus is made up of a sampling system, the measurement frequency band is limited. In other words, with regard to the fluxgate current sensor apparatus, the response frequency band, that is, the frequency band that responds to variations in a current to be measured, is not allowed to exceed the excitation frequency which is the frequency of the excitation current, that is, an alternating current applied to the coil of the fluxgate element, due to the Nyquist frequency which is the threshold frequency of response. With regard to the fluxgate current sensor apparatus, since sampling is made at two points of positive and negative in one cycle of the excitation current, the sampling frequency is twice the excitation frequency. The Nyquist frequency is half the sampling frequency.

Moreover, when the negative feedback method is applied to the fluxgate current sensor apparatus, it is not so easy to widen the band of the negative feedback system having a sufficiently large loop gain since it is required to give enough consideration to measures against oscillation and so on.

As thus described, the prior-art fluxgate current sensor apparatus has the problem that although the response frequency band is wide enough for ordinary applications, it is difficult to further widen the response frequency band.

As disclosed in Published Unexamined Japanese Patent Application Hei 1-265168 (1989) and Published Unexamined Japanese Patent Application Hei 4-93772 (1992), for example, a method is known for widening the response frequency band of a current sensor apparatus in general, which is not limited to a fluxgate current sensor apparatus. In this method, a high frequency component of a current to be measured is detected by a coil coupled through alternating-current and magnetic coupling to a current path through which the current to be measured passes. On the other hand, a low frequency component of the current including a direct current is detected by a magnetic sensor element. Those two detection signals are combined. This method is called an alternating-current (AC) coupling method in the present patent application.

However, in the prior-art current sensor apparatus utilizing the AC coupling method, as disclosed in the above-mentioned publications, the coil for detecting a high frequency component is provided in the magnetic yoke itself. If the negative feedback method is applied, the coil for detecting a high frequency component functions as a coil for generating a feedback magnetic field, too, in many cases. As a result, the prior-art current sensor apparatus utilizing the AC coupling method has a problem that manufacturing costs of the apparatus are raised since winding the coil around the magnetic yoke requires difficult techniques, and the large number of turns of the coil makes the apparatus large-sized.

Furthermore, the prior-art current sensor apparatus utilizing the AC coupling method has the following essential problem. The prior-art techniques utilizing the AC coupling method have been mainly developed for a current sensor apparatus incorporating a Hall element as the magnetic sensor element. In such an apparatus, it is acceptable that the gap of the magnetic yoke is small. In contrast, in the current sensor apparatus incorporating a fluxgate element as the magnetic sensor element, the gap of the yoke is greater than that of the apparatus incorporating a Hall element. As a result, the current sensor apparatus incorporating a fluxgate element has a problem that the coil for detecting a high frequency component is large-sized and the apparatus is expensive, due to the following reason.

Inductance L of the coil for detecting a high frequency component wound around the magnetic yoke is expressed as $L=K \cdot N^2$ where the AL value (the inductance value per one turn of the coil) of the magnetic yoke is K and the number of turns of the coil is N.

It is assumed that the magnetic yoke is made of a high-permeability ferrite material having a cross-sectional area of about 5 by 5 mm. If the length of the gap of the yoke is 1 mm, that is, a typical length for a current sensor apparatus incorporating a Hall element, the AL value K of the yoke is about 1 $\mu$H/T. If the length of the gap of the yoke is 10 mm, that is, a typical length for a current sensor apparatus incorporating a fluxgate element, the AL value K of the yoke is about 0.1 $\mu$H/T, which is 1/10 of the value K obtained when the Hall element is used.

If the direct current resistance of the coil for detecting a high frequency component is 'r', cutoff frequency 'f' of the coil is $f=r/2\pi K \cdot N^2$. Therefore, in order to obtain the same cutoff frequency when the fluxgate element is used, it is required that, for example, the number of turns of the coil is about three times that of the apparatus using the Hall element and the coil is made of a wire having a cross section about three times as large as that of the coil of the apparatus using the Hall element.

As thus described, if the prior-art AC coupling method is directly applied to the current sensor apparatus incorporating the fluxgate element, the coil for detecting a high frequency component is large-sized and the apparatus is expensive.

In addition, in the prior-art techniques using the AC coupling method, no consideration is given to the cutoff frequency and the excitation frequency of the coil for detecting a high frequency component that are problems specific to the sampling system. Therefore, if the prior-art AC coupling method is directly applied to the current sensor apparatus incorporating the fluxgate element, a beat may be produced from the frequency of a varying component of a current to be measured and the excitation frequency.

DISCLOSURE OF THE INVENTION

It is a first object of the invention to provide a current sensor apparatus for reducing measurement errors resulting from variations in the position of a current path passing through the space inside a magnetic yoke, without losing the convenience of use and without increasing the current sensor apparatus in size and weight.

It is a second object of the invention to provide a current sensor apparatus for widening the response frequency band while suppressing a beat generated by the frequency of a varying component of a current to be measured and the excitation frequency, and reducing difficulties in manufacturing the apparatus and the size of the apparatus.

A first current sensor apparatus of the invention comprises: a ring-shaped magnetic yoke through which a magnetic flux generated by an electric current flowing through an electric path passes, the yoke surrounding the current path, part of the yoke having a gap; and a magnetic sensor element placed in the gap of the magnetic yoke and provided for detecting a magnetic field in the gap generated by the current flowing through the current path. A magnetic path of the flux passing through the magnetic yoke includes: a first magnetic path, mainly passing through the magnetic sensor element, through which a part of the flux passing through the magnetic yoke passes; and a second magnetic path through which another part of the flux passing through the magnetic yoke passes.

According to the first current sensor apparatus of the invention, the magnetic sensor element detects the magnetic field in the gap generated by the current flowing through the current path, based on the magnetic flux passing through the first magnetic path. The second magnetic path may be used for a function other than detecting a magnetic field by the magnetic sensor element.

The first current sensor apparatus may comprise a magnetic field interrupter, placed between the current path and the gap, for interrupting a magnetic field corresponding to a magnetic flux that is generated by the current passing through the current path and does not pass through the magnetic yoke, so that the magnetic field is cut off from the magnetic sensor element. In addition, the second magnetic path may be made up of the field interrupter. In this current sensor apparatus the field interrupter cuts off the magnetic field corresponding to the magnetic flux that is generated by the current passing through the current path and does not pass through the magnetic yoke from the magnetic sensor element.

In the first current sensor apparatus comprising the field interrupter, the field interrupter may be separated from the magnetic yoke or may be integrated with the magnetic yoke. Part of the field interrupter may have a gap. A center position of the gap of the field interrupter may be off a straight line drawn through a center of the current path and a center of the gap of the magnetic yoke. The field interrupter may be made of a magnetic substance. The magnetic sensor element may be a fluxgate magnetic sensor element, for example.

The first current sensor apparatus may further comprise a high frequency component detection coil for detecting a high frequency component of the current flowing through the current path, and the detection coil may be placed in the second magnetic path.

In this current sensor apparatus the magnetic sensor element detects the magnetic field in the gap generated by the current flowing through the current path. The detection coil detects a high frequency component of the current flowing through the current path. In the apparatus the magnetic sensor element and the detection coil are placed in the different magnetic paths. Therefore, it is possible to determine the cutoff frequency and so on for each of the magnetic sensor element and the detection coil independently.

The first current sensor apparatus comprising the high frequency component detection coil may further comprise an attenuation means, placed in the first magnetic path, for attenuating a frequency component of the magnetic flux passing through the first magnetic path that is higher than a specific cutoff frequency.

In the first current sensor apparatus comprising the high frequency component detection coil, the magnetic sensor element may have a magnetic core placed in the first magnetic path and a sensor coil wound around the core and provided for detecting a magnetic field corresponding to the flux passing through the first magnetic path. In this case the apparatus may further comprise: a drive means for driving the sensor coil by supplying an alternating excitation current that drives the core into a saturation region to the sensor coil; and a measurement means for measuring the current passing through the current path by detecting variations in inductance of the sensor coil. In the present invention the magnetic core is a core made of a magnetic substance having a magnetic saturation property on which the coil is wound. To drive the sensor coil means to supply an alternating current to the sensor coil.

The current sensor apparatus comprising the drive means and the measurement means may further comprise an attenuation means, placed in the first magnetic path, for attenuating a frequency component of the magnetic flux passing through the first magnetic path that is higher than a specific cutoff frequency. The cutoff frequency may be equal to or lower than a Nyquist frequency obtained from a frequency of the excitation current. In the current sensor apparatus comprising the drive means and the measurement means, the drive means may have a series resonant circuit part of which is made up of the sensor coil and may supply a resonant current flowing through the series resonant circuit as the excitation current to the sensor coil. The current sensor apparatus comprising the drive means and the measurement means may further comprise a current supply means for supplying an electric current to the sensor coil, the current including a direct current and having a frequency different from a frequency of the excitation current. In this case the current supply means may supply a negative feedback current to the sensor coil for negative feedback of an output of the measurement means to the sensor coil. The high frequency component detection coil may form a path for supplying the negative feedback current to the sensor coil.

In the current sensor apparatus comprising the drive means and the measurement means, the measurement means may have: an inductance element connected to the sensor coil in series; and a differentiation circuit for differentiating a voltage generated across the inductance element and outputting a signal responsive to the current flowing through the current path.

In the first current sensor apparatus comprising the high frequency component detection coil, the second magnetic path may include a gap.

In the first current sensor apparatus comprising the high frequency component detection coil, the second magnetic path may be located between the current path and the first magnetic path. In this case, the current sensor apparatus may further comprise a magnetic field interrupting member made of a magnetic substance and placed in the second magnetic path, the member interrupting a magnetic field corresponding to a magnetic flux that is generated by the current passing through the current path and does not pass through the magnetic yoke, so that the magnetic field is cut off from the magnetic sensor element. In addition, the high frequency component detection coil may be wound around the field interrupting member.

A second current sensor apparatus of the invention comprises: a ring-shaped magnetic yoke through which a magnetic flux generated by an electric current flowing through an electric path passes, the yoke surrounding the current path, part of the yoke having a gap; a magnetic sensor element placed in the gap of the magnetic yoke and provided for detecting a magnetic field in the gap generated by the current flowing through the current path; and a magnetic field interrupter, placed between the current path and the gap, for interrupting a magnetic field corresponding to a magnetic flux that is generated by the current passing through the current path and does not pass through the magnetic yoke, so that the magnetic field is cut off from the magnetic sensor element.

In the second current sensor apparatus the field interrupter cuts off the magnetic field corresponding to the magnetic flux that is generated by the current passing through the current path and does not pass through the magnetic yoke from the magnetic sensor element.

In the second current sensor apparatus, the field interrupter may be separated from the magnetic yoke or may be integrated with the magnetic yoke. Part of the field interrupter may have a gap. A center position of the gap of the field interrupter may be off a straight line drawn through a center of the current path and a center of the gap of the magnetic yoke. The field interrupter may be made of a magnetic substance. The magnetic sensor element may be a fluxgate magnetic sensor element, for example.

Other and further objects, features and advantages of the invention will appear more fully from the following description.

BEST MODE FOR CARRYING OUT THE INVENTION

Preferred embodiments of the invention will now be described in detail with reference to the accompanying drawings.

[First Embodiment]

Figure 1:
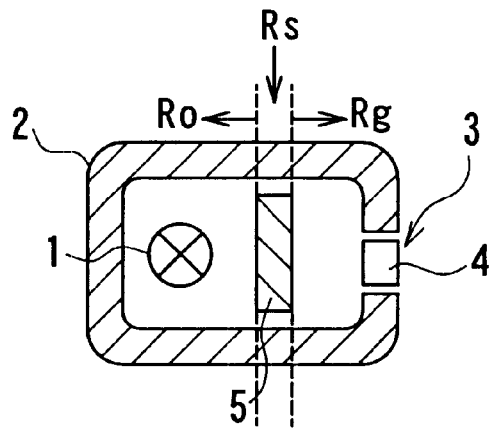
FIG. 1 is a cross-sectional view of a current sensor apparatus of a first embodiment of the invention.
Figure 2:
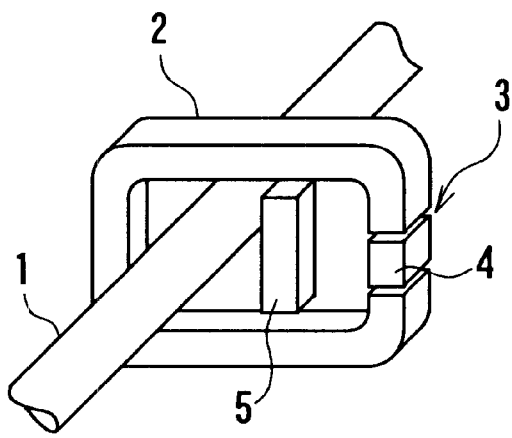
FIG. 2 is a perspective view of the current sensor apparatus shown in FIG. 1.

FIG. 1 is a cross section of a current sensor apparatus of a first embodiment of the invention. FIG. 2 is a perspective view of the current sensor apparatus shown in FIG. 1. The current sensor apparatus comprises: a ring-shaped magnetic yoke 2 surrounding a current path 1, part of the yoke having a gap 3; and a magnetic sensor element 4 placed in the gap 3 of the magnetic yoke 2. The magnetic sensor element 4 detects a magnetic field in the gap 3 generated by a current flowing through the current path 1 to measure the current flowing through the current path 1. The current sensor apparatus further comprises a magnetic field interrupter 5, placed between the current path 1 and the gap 3, for interrupting a magnetic field corresponding to a magnetic flux that is generated by the current passing through the current path 1 and does not pass through the magnetic yoke 2, so that the magnetic field is cut off from the magnetic sensor element 4.

Although the magnetic yoke 2 has the shape of a rounded rectangular ring in this embodiment, it is not limited to this shape. The magnetic field interrupter 5 is plate-shaped. Each end of the field interrupter 5 faces toward the inner surface of the magnetic yoke 2 at a specific distance and separated from the yoke 2. The yoke 2 and the field interrupter 5 are each made of a magnetic substance. The magnetic sensor element 4 may be a fluxgate element but is not limited to the fluxgate element.

The operation of the current sensor apparatus of the embodiment will now be described. In the apparatus a current flowing through the current path 1 generates a magnetic flux passing through the magnetic yoke 2. The magnetic sensor element 4 detects a magnetic field inside the gap 3 corresponding to the flux. The value of the current flowing through the current path 1 is obtained from an output of the sensor element 4.

The field interrupter 5 interrupts a magnetic field corresponding to a magnetic flux that is generated by the current flowing through the current path 1 and does not pass through the yoke 2, so that the magnetic field is cut off from the sensor element 4. As a result, it is possible to reduce measurement errors resulting from variations in the position of the current path 1 passing through the space inside the yoke 2.

The operation of the magnetic field interrupter 5 will now be described in detail. As shown in FIG. 1, the magnetic path of the flux passing through the yoke 2 includes: a first magnetic path, mainly passing through the gap 3 and the sensor element 4, through which a part of the magnetic flux passing through the yoke 2 passes; and a second magnetic path, mainly passing through the field interrupter 5, through which another part of the magnetic flux passing through the yoke 2 passes. As shown in FIG. 1, the reluctance of the first magnetic path, that is, the reluctance of the magnetic flux passing through the gap 3 of the flux passing through the yoke 2, is represented by Rg. The reluctance of the second magnetic path, that is, the reluctance of the magnetic flux passing through the interrupter 5 of the flux passing through the yoke 2, is represented by Rs. The reluctance of the portion of the yoke 2 where the magnetic flux made up of the flux passing through the gap 3 and the flux passing through the interrupter 5 passes is represented by $R_o$.

Figure 3:
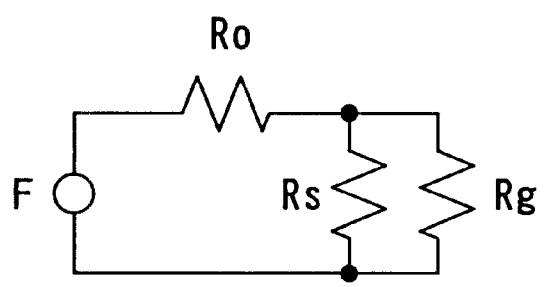
FIG. 3 is a circuit diagram of an equivalent circuit of the current sensor apparatus shown in FIG. 1.

The equivalent circuit of the current sensor apparatus shown in FIG. 1 is the one shown in FIG. 3 where the magnetomotive force generated by the current passing thorough the current path 1 is F. In the equivalent circuit reluctance $R_0$ and a parallel circuit of reluctance Rg and reluctance Rs are connected in series to the source of magnetomotive force F.

Where a current to be measured is I (A), magnetomotive force F is represented by F=I (A/m). Magnetomotive force Fg applied to the gap 3 in which the sensor element 4 is placed is represented by the following equation.

$$Fg=F\cdot(Rg//Rs/Rg//Rs+R_o)$$

The reluctance of the parallel circuit of reluctance Rg and reluctance Rs is represented by Rg//Rs wherein Rg//Rs= Rg·Rs/(Rg+Rs).

If reluctance $R_0$ of the portion of the yoke 2 where the magnetic flux made up of the flux passing through the gap 3 and the flux passing through the interrupter 5 passes is small enough and the relation holds that $R_0$<<Rg//Rs, Fg is equal to F. Therefore, magnetomotive force Fg applied to the gap 3 in which the sensor element 4 is placed is independent of reluctance Rs. That is, if the reluctance of the magnetic path is sufficiently greater than the reluctance of the yoke 2, the field interrupter 5 placed between the current path 1 and the gap 3 will not affect the magnetomotive force applied to the gap 3 in which the sensor element 4 is placed, that is, the magnetic field applied to the sensor element 4. This means that, without affecting the magnetic field applied to the sensor element 4 by the flux passing through the yoke 2, the field interrupter 5 placed between the current path 1 and the gap 3 interrupts the magnetic field that might be directly applied to the sensor element 4 from the current path 1 without passing through the yoke 2.

Figure 4:
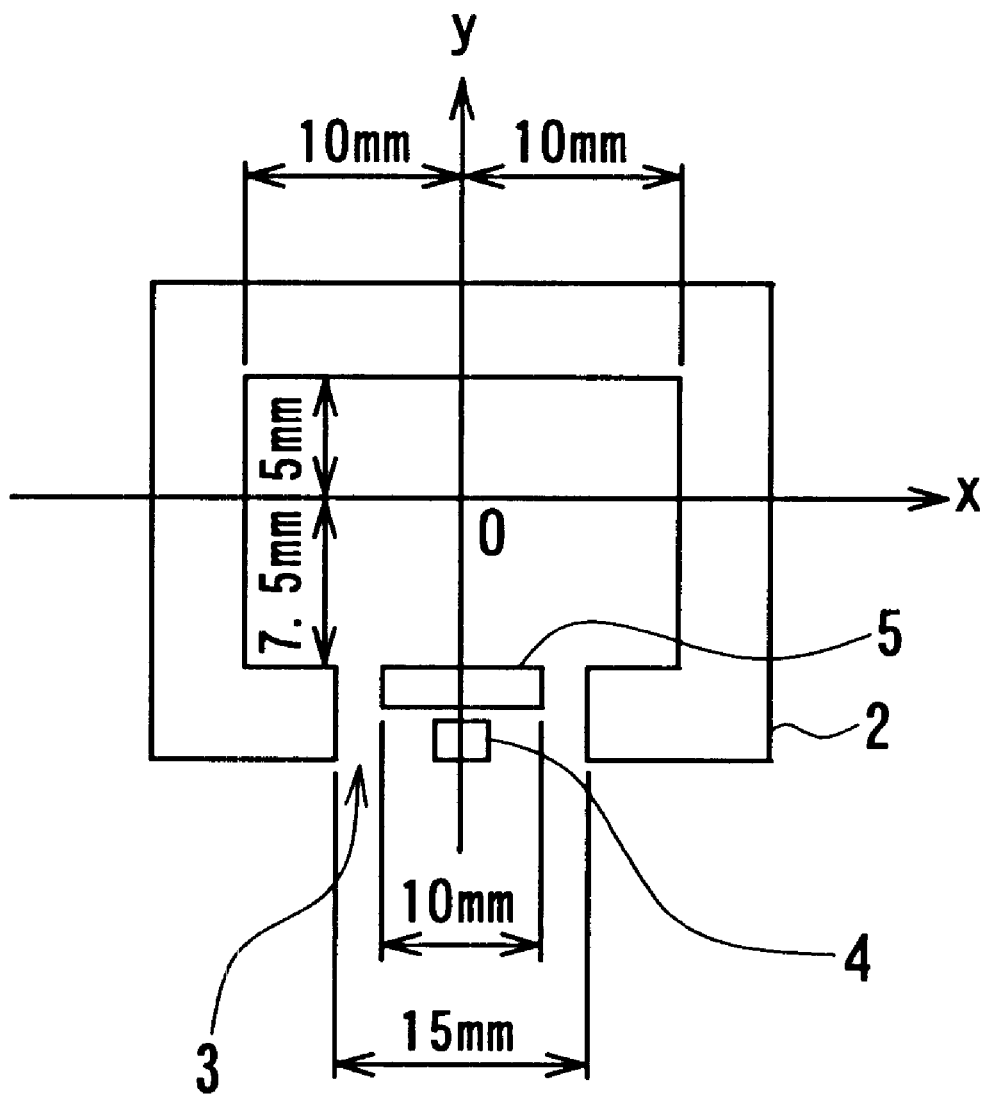
FIG. 4 is an explanatory view for describing conditions for a computer simulation for confirming the effect of the first embodiment of the invention.
Figure 5:
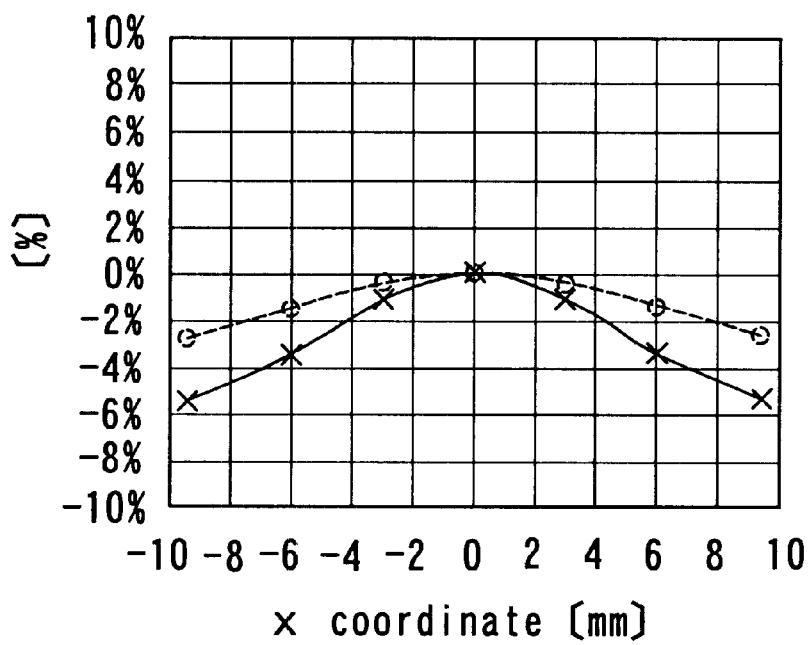
FIG. 5 is a lot showing a result of the computer simulation for confirming the effect of the first embodiment.
Figure 6:
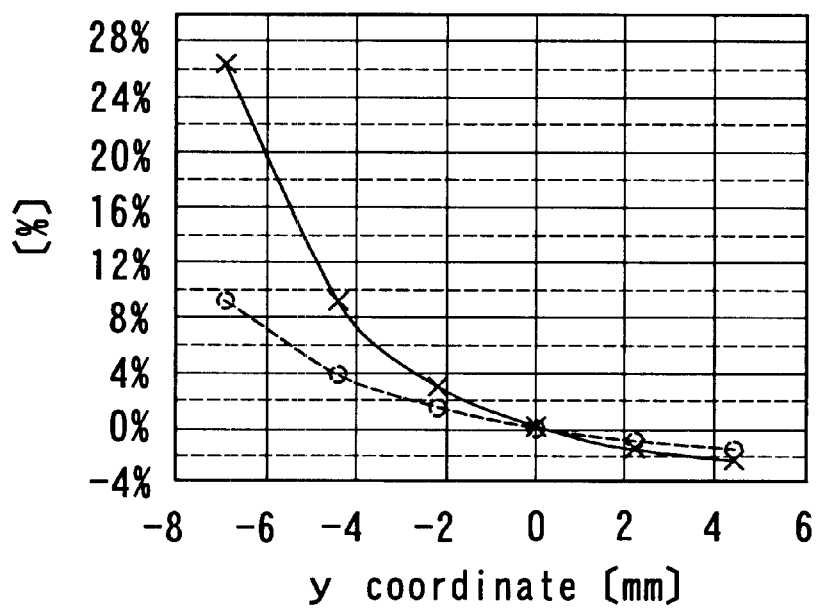
FIG. 6 is a plot showing a result of the computer simulation for confirming the effect of the first embodiment.

Reference is now made to FIG. 4 to FIG. 6 to describe the result of a computer simulation made for confirming the effect of the field interrupter 5. Referring to FIG. 4, the conditions for the simulation will be described. The magnetic sensor element 4 is placed in the gap 3 of the magnetic yoke 2. Although not shown, the current path is located in the space inside the yoke 2. The field interrupter 5 is placed between the sensor element 4 and the current path. The space inside the yoke 2 has a rectangular cross section having a length of 20 mm in the horizontal direction of FIG. 4 and a length of 12.5 mm in the vertical direction. A position in the space inside the yoke 2 is indicated with x and y coordinates wherein the origin 0 is the position located in the middle in the horizontal direction and at a distance of 7.5 mm upward from the gap 3, and the x direction is the horizontal direction and the y direction is the vertical direction. For x coordinates the right side of the origin 0 is positive and the left side is negative. For y coordinates the upper side of the origin 0 is positive and the lower side is negative. The length of the gap 3 is 15 mm and the length of the interrupter 5 is 10 mm.

FIG. 5 and FIG. 6 are plots for illustrating the result of the simulation. FIG. 5 shows variations in the magnetic flux density in the center point of the sensor element 4 given in percent wherein only the x coordinate of the position of the current path is changed with respect to the position of the current path located in the origin 0. FIG. 6 shows variations in the flux density in the center point of the sensor element 4 given in percent wherein only the y coordinate of the position of the current path is changed with respect to the position of the current path located in the origin 0. The sensor element 4 has a drum-shaped magnetic core. The flux density in the center point of the sensor element 4 is the flux density in the center portion of the core. In FIG. 5 and FIG. 6 the solid lines indicate that the field interrupter 5 is not provided and the broken lines indicate that the interrupter 5 is provided. As shown, variations in flux density resulting from variations in the position of the current path are smaller in the case where the interrupter 5 is provided, compared to the case where the interrupter 5 is not provided. As a result, measurement errors are reduced.

According to the current sensor apparatus of the embodiment thus described, it is possible to reduce measurement errors resulting from variations in the position of the current path 1 passing through the space inside the magnetic yoke 2, without sacrificing the convenience of use of the apparatus in that a current is measured by simply passing the electric wire through the space inside the yoke 2 and without increasing the apparatus in size and weight.

In this embodiment, if the magnetic sensor element 4 is a fluxgate element, the effect of reducing measurement errors resulting from variations in the position of the current path 1 is remarkable and the excellent current sensor apparatus is implemented.

[Second Embodiment]

Figure 7:
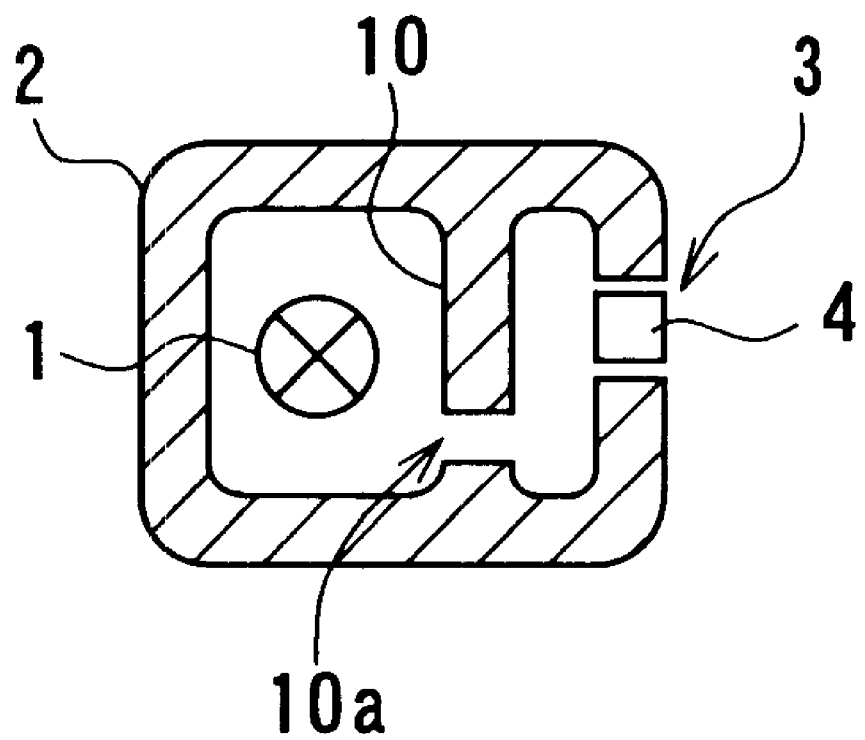
FIG. 7 is a cross-sectional view of a current sensor apparatus of a second embodiment of the invention.

FIG. 7 is a cross section of a current sensor apparatus of a second embodiment of the invention. In the current sensor apparatus a magnetic field interrupter 10 is provided in place of the magnetic field interrupter 5 of the current sensor apparatus shown in FIG. 1. The field interrupter 10 is integrated with the magnetic yoke 2 and made of the same magnetic substance as the yoke 2. The field interrupter 10 is plate-shaped and both ends thereof are coupled to the inner surface of the yoke 2. Part of the field interrupter 10 has a gap 10a. The gap 10a is located in a position off the middle of the field interrupter 10 (shifted downward in FIG. 7). In this embodiment the gap 3 of the yoke 2 is located in a position off the middle of one side of the yoke 2 toward the direction opposite to the gap 10a (shifted upward in FIG. 7). Therefore, the center position of the gap 10a of the field interrupter 10 is off the straight line drawn through the center of the current path 1 and the center of the gap 3 of the yoke 2. As a result, the effect of interrupting a magnetic field is greater, compared to the case in which the center position of the gap 10a is located on the straight line drawn through the center of the current path 1 and the center of the gap 3 of the yoke 2. In order to increase the effect of interrupting a magnetic field, it is preferred that the amount of shift of the gap 10a of the field interrupter 10 from the gap 3 of the yoke 2 is greater.

In the current sensor apparatus of the first embodiment the field interrupter 5 is separated from the yoke 2. Therefore, some processing is required for placing the field interrupter 5 in the specific position. In contrast, the field interrupter 10 is integrated with the yoke 2 in the second embodiment. As a result, no processing is required for installing the field interrupter 10. In addition, since the yoke 2 is usually made of ferrite, the yoke 2 and the field interrupter 10 are easily formed, according to this embodiment.

The remainder of configuration, operation and effects of the second embodiment are similar to those of the first embodiment.

In Published Unexamined Japanese Patent Application Hei 8-15322 (1996), a current sensor apparatus is disclosed in which a magnetic core is divided into a ring-shaped core on which no feedback winding is placed and an H-shaped core on which a feedback winding is placed. The H-shaped core detects a leakage flux in a gap of the ring-shaped core. The H-shaped core together with a magnetic detection element placed near the H-shaped core is covered with a magnetic shield member. The positions of the horizontal portion of the H-shaped core and the magnetic detection element with respect to each other disclosed in the publication are similar to the positions of the field interrupter 10 and the sensor element 4 of the second embodiment of the invention. However, the current sensor apparatus disclosed in the publication has the configuration in which the H-shaped core is placed outside the gap of the ring-shaped core and the magnetic detection element is placed at the end of the H-shaped core opposite to the ring-shaped core. This configuration is totally different from that of the current sensor apparatus of the second embodiment of the invention in which the sensor element 4 is placed in the gap 3 of the yoke 2. In addition, the horizontal portion of the H-shaped core is provided for making a magnetic path through which the magnetic flux generated by the feedback winding passes and has a function different from that of the field interrupter 10 in the yoke 2 of the second embodiment.

[Third Embodiment]

Figure 8:
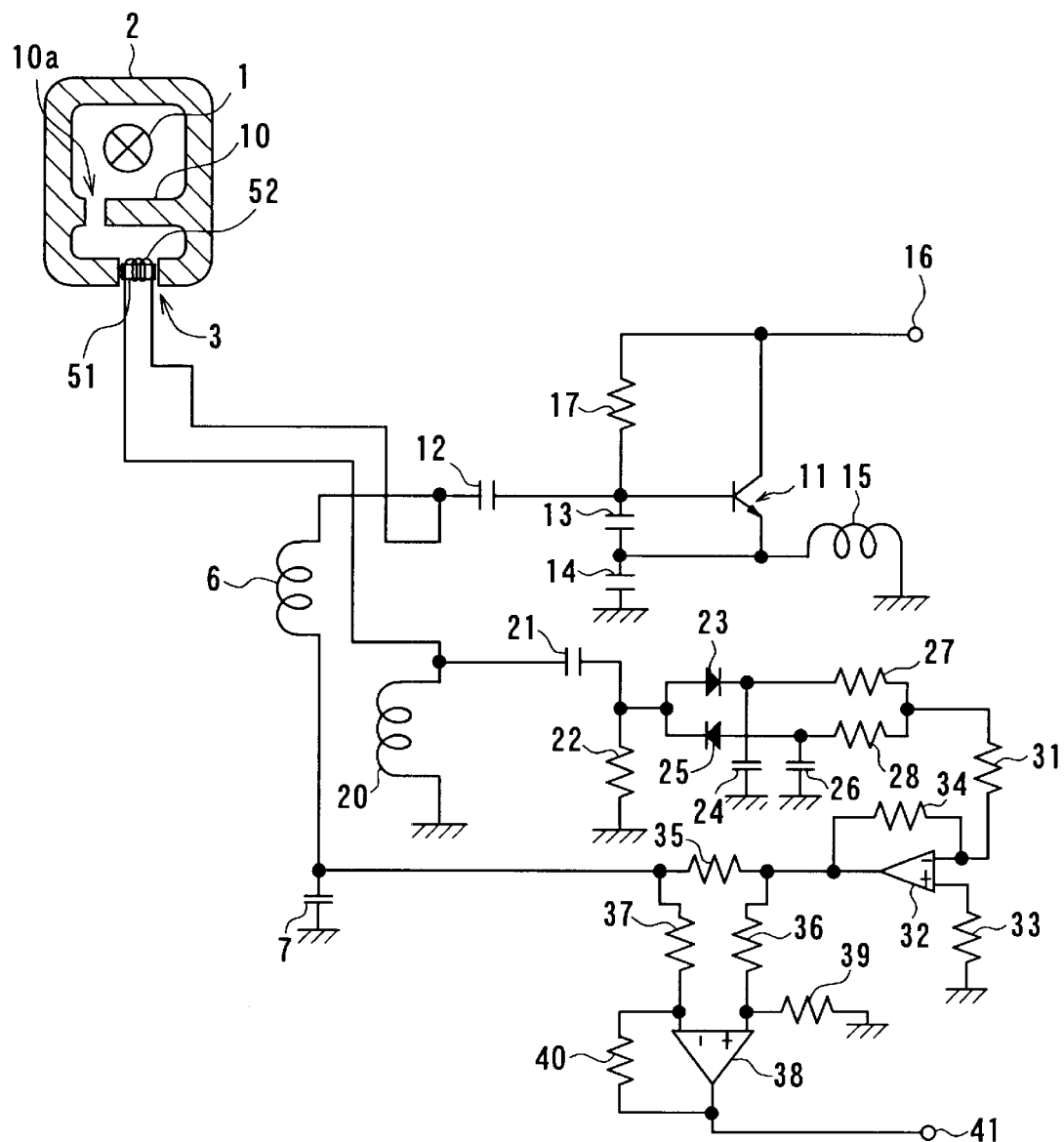
FIG. 8 is a circuit diagram illustrating the configuration of a current sensor apparatus of a third embodiment of the invention.

A current sensor apparatus of a third embodiment of the invention will now be described. FIG. 8 is a circuit diagram of the current sensor apparatus of the third embodiment. The current sensor apparatus is similar to the apparatus of the second embodiment except that the magnetic sensor element 4 is a fluxgate magnetic sensor element and the periphery circuitry of the element 4 is added.

In the current sensor apparatus the fluxgate element having a magnetic core 51 and a coil 52 wound around the core 51 is placed in the gap 3 of the yoke 2 of the current sensor apparatus of the second embodiment.

The circuit configuration of the current sensor apparatus of the third embodiment will now be described. Positive and negative power supply circuits for operational amplifiers are not shown, according to the practice.

An end of a detection coil 20 is connected to an end of the coil 52. The other end of the detection coil 20 is grounded. An end of a coil 6 making a path for supplying a negative feedback current to the coil described later is connected to the other end of the coil 52. The other end of the coil 6 is grounded through a capacitor 7.

The current sensor apparatus further comprises: a drive circuit having a series resonant circuit part of which is made up of the coil 52 and supplying a resonant current flowing through the series resonant circuit, as an alternating current for driving the core 51 into a saturation region, to the coil 52; and a detection and feedback circuit for detecting a magnetic field to be measured by detecting variations in resonant current flowing through the coil 52 that corresponds to inductance variations of the coil 52 and for supplying a negative feedback current used for the negative feedback method to the coil 52.

The drive circuit has an oscillation circuit including the series resonant circuit. The configuration of the oscillation circuit is as follows. The oscillation circuit incorporates a transistor 11. The base of the transistor 11 is connected to the other end of the coil 52 through a capacitor 12 used for resonance. An end of a capacitor 13 used for feedback is connected to the base of the transistor 11. An end of the capacitor 14 used for feedback and the emitter of the transistor 11 are connected to the other end of the capacitor 13. The other end of the capacitor 14 is grounded. The emitter of the transistor 11 is grounded through a load coil 15. The collector of the transistor 11 is connected to a power input 16 and to the base through a bias resistor 17. The configuration of this oscillation circuit is that of a Clapp oscillation circuit wherein Cs<<Cb and Cs<<Ce, the capacitance of each of the capacitors 12, 13 and 14 being Cs, Cb and Ce, respectively.

The configuration of the detection and feedback circuit is as follows. An end of a capacitor 21 is connected to the connection point between the coil 52 and the detection coil 20. The other end of the capacitor 21 is grounded through a resistor 22. The capacitor 21 and the resistor 22 make up a differentiation circuit for differentiating the voltage generated across the coil 20 and outputting a signal corresponding to the magnetic field to be measured.

The anode of a diode 23 and the cathode of a diode 25 are connected to the connection point between the capacitor 21 and the resistor 22. The cathode of the diode 23 is grounded through a capacitor 24. The anode of the diode 25 is grounded though a capacitor 26. The diode 23 and the capacitor 24 make up the positive peak hold circuit. The diode 25 and the capacitor 26 make up the negative peak hold circuit.

An end of a resistor 27 is connected to the connection point between the diode 23 and the capacitor 24. An end of a resistor 28 is connected to the connection point between the diode 25 and the capacitor 26. The other end of each of the resistors 27 and 28 is connected to an end of a resistor 31. The resistors 27 and 28 make up the resistor adding circuit for adding a positive output value held at the positive peak hold circuit to a negative output value held at the negative peak hold circuit. A detection signal corresponding to the external magnetic field is present at an end of the resistor 31.

The other end of the resistor 31 is connected to the inverting input of an operational amplifier 32. The noninverting input of the operational amplifier 32 is grounded through a resistor 33. The output of the operational amplifier 32 is connected to the inverting input through a resistor 34. The amplifier 32 and the resistors 31, 33 and 34 make up an inverting amplifier.

The output of the operational amplifier 32 is connected to an end of a resistor 35 for detecting an output. The other end of the resistor 35 is connected to the connection point between the coil 6 and a capacitor 7. The one end of the resistor 35 is connected to the noninverting input of an operational amplifier 38 through a resistor 37. The noninverting input of the amplifier 38 is grounded through a resistor 39. The output of the amplifier 38 is connected to the inverting input through a resistor 40 and to an detection output 41. The amplifier 38 and the resistors 36, 37, 39 and 40 make up a differential amplifier.

The detection coil 20, the coil 6 and the capacitor 7 are not only part of the oscillation circuit as the drive circuit but also part of the detection and feedback circuit.

The operation of the current sensor apparatus of the embodiment will now be described. An alternating current is supplied to the coil 52 by the oscillation circuit such that the core 51 is driven into the saturation region. The alternating current is a resonant current that is equal to the current value limited by the supply voltage multiplied by value Q of the resonant circuit. A method taken in this embodiment is to detect variations in waveform of resonant current as a method of capturing variations in inductance of the coil 52 as an output signal of the current sensor apparatus. To be specific, the voltage across the detection coil 20 connected to the coil 52 in series and having a large saturation current is differentiated at the differentiation circuit made up of the capacitor 21 and the resistor 22. A positive output value of an output of the differentiation circuit is held at the positive peak hold circuit made up of the diode 23 and the capacitor 24. A negative output value of the output of the differentiation circuit is held at the negative peak hold circuit made up of the diode 25 and the capacitor 26. The positive and negative output values are added to each other at the resistor adding circuit made up of the resistors 27 and 28. A detection signal corresponding to the external magnetic field is thus obtained.

When no external magnetic field is present, the positive and negative portions of the differential waveform of the voltage across the detection coil 20 are symmetric, and the sum of positive and negative peak values (the difference between the absolute values) of the differential waveform is zero. In contrast, when the external field is applied to the coil 52, the positive and negative portions of the differential waveform are asymmetric. As a result, the sum of positive and negative peak values (the difference between the absolute values) of the differential waveform is other than zero, which depends on the external magnetic field. According to the embodiment, in such a manner, the external magnetic field is measured by obtaining the sum of positive and negative peak values (the difference between the absolute values) of the differential waveform.

As thus described, the detection and feedback circuit detects the magnetic field to be measured, based on a portion of the resonant current flowing through the coil 52 that drives the core 51 into the saturation region. In other words, the detection and feedback circuit detects the magnetic field to be measured, based on asymmetric positive and negative components of the resonant current flowing through the coil 52.

The detection signal obtained at the adding circuit made up of the resistors 27 and 28 is inverted and amplified at the inverting amplifier made up of the operational amplifier 32 and the resistors 31, 33 and 34. The signal is then carried through the resistor 35 and applied to the connection point between the coil 6 and the capacitor 7. A negative feedback current is thereby supplied to the coil 52 through the coil 6 and magnetomotive force in the direction opposite to the external magnetic field is applied to the coil 52. In this embodiment, since the inverting amplifier has outputs of both positive and negative polarities, negative and positive feedback currents (wherein one of the directions of the external field is defined as positive) corresponding to the positive and negative polarities of the external magnetic field are supplied from the output of the inverting amplifier to the coil 52. Therefore, the end of the inverting amplifier on the side of the coil 52 is grounded.

The external magnetic field is measured as follows. The negative feedback current, that is, the current corresponding to the external field, is converted to a voltage by the resistor 35. The voltage is amplified at the differential amplifier made up of the operational amplifier 38 and the resistors 35, 36, 39 and 40, and then given to the detection output 41. A detection output signal corresponding to the external field is then outputted from the detection output 41.

The balance between the external field and the magnetomotive force generated by the negative feedback current would not change unless the ampere turn of the coil 52 changes. Consequently, the current sensor apparatus of the embodiment achieves reduced sensitivity variations, excellent linearity, and excellent stability against changes in temperature, supply voltage and so on. In addition, since the large amplitude excitation method is taken, the offset is zero, according to the principle, and no drift due to external perturbations occurs.

A specific example of the current sensor apparatus actually fabricated will now be described. In this example, the yoke 2 is made of Mn—Zn-base ferrite and has a ring shape with shorter sides (the sides along the horizontal direction of FIG. 8) 24 mm long and longer sides (the sides along the vertical direction of FIG. 8) 32 mm long, and has a thickness of 4 mm. The gap 3 of the yoke 2 is 6 mm and the gap 10a of the field interrupter 10 is 3 mm in length. The cross section of the space inside the yoke 2 through which the current path 1 passes has the shape of a rectangle whose sides along the horizontal direction of FIG. 8 are 16 mm long and sides along the vertical direction of FIG. 8 are 14 mm long.

The magnetic sensor element is a fluxgate element incorporating the rod-shaped core 51 made of Ni—Cu—Zn-base ferrite and having a diameter of 0.8 mm and a length of 2.5 mm and the coil 52 made of 250 turns of urethane-coated lead wire having a diameter of 0.03 mm wound around the core 51.

In this example variations in output of the current sensor apparatus is 1 percent or less when the position of the current path 1 shifts from the designated position to ±2 mm in each direction wherein the current path 1 is made of a coated wire having a diameter of 6 mm.

According to the current sensor apparatus of the embodiment thus described, it is possible to resolve the drawback that measurement errors result from variations in the position of the current path due to the wide gap of the magnetic yoke, which is the only drawback of the current sensor apparatus incorporating the fluxgate element having excellent features as a magnetic sensor element of a current sensor apparatus. The apparatus is therefore very useful for measuring a direct current in an electric car or solar-electric power generation.

According to the embodiment, a resonant current of the resonant circuit is supplied to the coil 52. As a result, an alternating current that drives the core 51 into the saturation region is easily supplied to the coil 52. In addition, the configuration of the apparatus is simple since it is not required to wind any coil for excitation around the core 51 besides the coil 52.

According to the embodiment, the negative feedback current used for the negative feedback method is supplied to the coil 52 through the coil 6 connected to the coil 52 in parallel in terms of alternating current. As a result, the feedback current is easily supplied to the coil 52 without causing a loss of resonant current.

According to the embodiment, a detection output of the order of volts is easily obtained by inserting the detection coil 20 to the resonant circuit, without reducing value Q of the resonant circuit, that is, without causing insufficiency in resonant current supplied to the coil 52. In addition, the peak hold circuit is implemented by the simple and inexpensive one utilizing the diode and the capacitor. The detection coil 20 is able to obtain a sufficiently large output even when the inductance value thereof is a few percent of the inductance value of the coil 52. Therefore, since the number of turns of the detection coil 20 is small and the saturation current value is sufficiently large in general, the detection coil 20 will not be saturated by the drive current (resonant current) of the coil 52.

Through those techniques, the large amplitude method and the negative feedback method are applicable while a magnetic core, such as a ferrite core, having a large saturation field and large nonlinearity is used. It is thereby possible to use a fluxgate element for detecting a large magnetic field or a large electric current.

The features of the current sensor apparatus of the embodiment are listed below.

(1) Measurement errors resulting from variations in the position of the current path through which a current to be measured passes are small.

(2) Since the negative feedback method is taken, sensitivity variations are reduced and thermal characteristics are improved automatically.

(3) Thus, no sensitivity adjustment or thermal characteristic compensation is required.

(4) No offset adjustment is required.

(5) The apparatus exhibits excellent properties since the large amplitude excitation method is applied.

(6) No special method is required for fabricating the sensor section.

(7) Since resonant current is utilized, the sensor coil is driven at a low supply voltage and a high frequency.

(8) No special material or method is required for fabricating the apparatus and the circuit is very simple. As a result, the apparatus is manufactured at an extremely low cost and it is possible to meet the great demand.

(9) The apparatus has an excellent frequency response.

(10) Power consumption is low since resonant current is used.

(11) The apparatus is small and light-weight since the configuration is simple.

The magnetic yoke 2 and the field interrupter 5 of the first embodiment may be used in place of the magnetic yoke 2 and the field interrupter 10 of the current sensor apparatus shown in FIG. 8. In the first to third embodiments the magnetic sensor element is not limited to the fluxgate element but may be any other element such as a Hall element.

According to the current sensor apparatus of the invention including the first to third embodiments, the magnetic field interrupter is provided between the current path and the gap of the magnetic yoke. The field interrupter interrupts a magnetic field corresponding to a magnetic flux that is generated by a current passing through the current path and does not pass through the magnetic yoke, so that the magnetic field is cut off from the magnetic sensor element. As a result, it is possible to reduce measurement errors resulting from variations in the position of the current path passing through the space inside the magnetic yoke, without sacrificing the convenience of use of the apparatus and without increasing the apparatus in size and weight.

If the field interrupter is integrated with the magnetic yoke and part of the interrupter has a gap, the effect of interrupting a magnetic field is further enhanced when the center of the gap of the interrupter is off the straight line drawn through the center of the current path and the center of the gap of the yoke.

If the magnetic sensor element is a fluxgate element, the effect of reducing measurement errors resulting from variations in the position of the current path is remarkable and the excellent current sensor apparatus is implemented.

[Fourth Embodiment]

Figure 9:
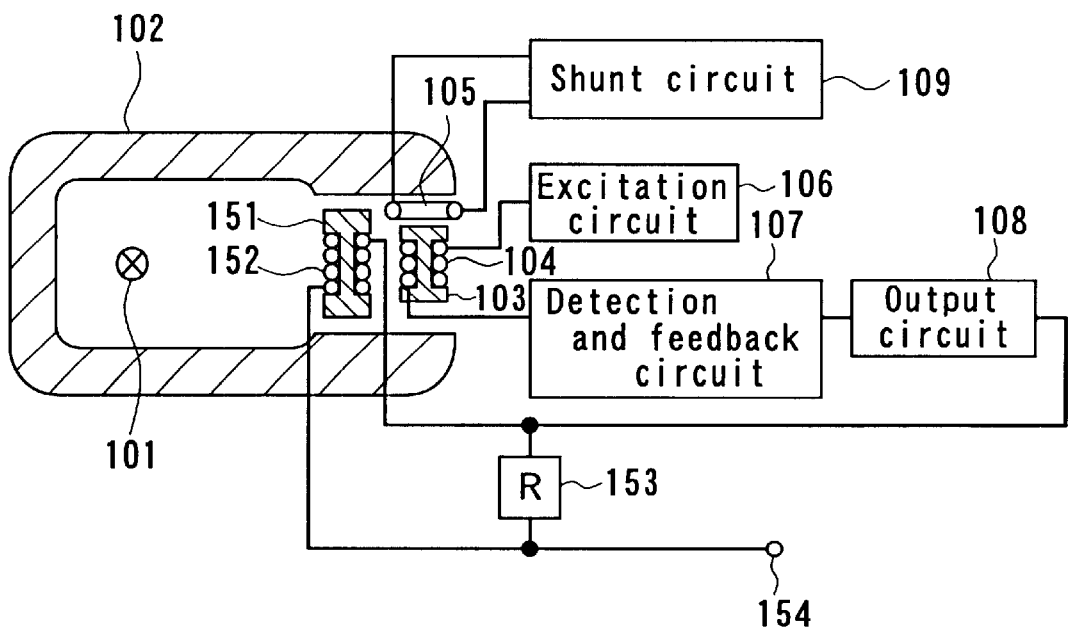
FIG. 9 is an explanatory view illustrating the configuration of a current sensor apparatus of a fourth embodiment of the invention.
Figure 10:
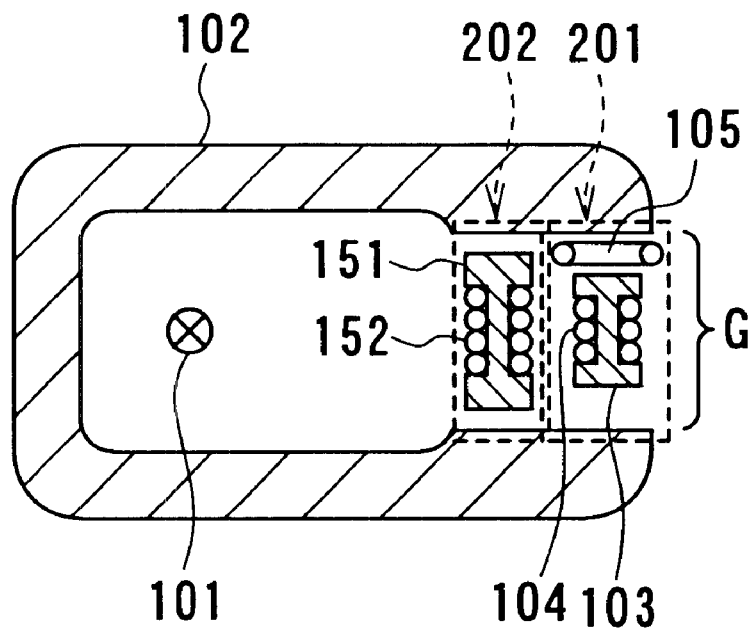
FIG. 10 is a cross-sectional view of the main part of the current sensor apparatus shown in FIG. 9.

FIG. 9 is an explanatory view illustrating the configuration of a current sensor apparatus of a fourth embodiment of the invention. FIG. 10 is a cross section of the main part of the current sensor apparatus. As shown in FIG. 10, the current sensor apparatus comprises a ring-shaped magnetic yoke 102 through which a magnetic flux passes, the flux being generated by a current to be measured flowing through a current path 101. The yoke 102 surrounds the current path 101 and part of the yoke 102 has gap G. The current sensor apparatus further comprises: a sensor magnetic core 103 placed in gap G of the yoke 102; and a sensor coil 104 wound around the core 103. The core 103 and the coil 104 make up a fluxgate magnetic sensor element and detect a magnetic field in gap G generated by the current to be measured flowing through the current path 101 so as to detect the current to be measured flowing through the current path 101.

The current sensor apparatus further comprises: a magnetic core 151 placed between the current path 101 and the core 103 in gap G of the yoke 102; and a detection coil 152 wound around the core 151 and provided for detecting a high frequency component of the current to be measured flowing through the current path 101. The coil 152 is coupled to the current path 101 through alternating-current and magnetic coupling through a magnetic flux passing through the coil 152.

As described above, the two magnetic cores 103 and 151 are placed in parallel in gap G of the yoke 102. Therefore, the magnetic path of the flux passing through the yoke 102 includes: a first magnetic path 201, mainly passing through the sensor core 103 and the sensor coil 104, through which a part of the magnetic flux passing through the yoke 102 passes; and a second magnetic path 202, mainly passing through the core 151 and the detection coil 152, through which another part of the magnetic flux passing through the yoke 102 passes. In other words, the sensor core 103 and the sensor coil 104 are placed in the first magnetic path 201. The coil 151 and the detection coil 152 are placed in the second magnetic path 202.

The current sensor apparatus further comprises a shunt coil 105 placed in the first magnetic path 201 in gap G of the yoke 102. The shunt coil 105 is a single-turn coil and provided for attenuating a frequency component of the magnetic flux passing through the first magnetic path 201 that exceeds a specific cutoff frequency.

As shown in FIG. 9, the current sensor apparatus further comprises: an excitation circuit 106 for supplying an alternating excitation current for driving the core 103 into a saturation region to the sensor coil 104 and driving the sensor coil 104; and a detection and feedback circuit 107 for detecting a current to be measured flowing through the current path 1. The detection and feedback circuit 107 detects a current flowing through the sensor coil 104 so as to detect variations in inductance of the sensor coil 104 and outputs a signal corresponding to the inductance variations, and generates a negative feedback current used for negative feedback of this signal to the sensor coil 104 and supplies the negative feedback current to the sensor coil 104. The current sensor apparatus further comprises an output circuit 108 for detecting the negative feedback current generated at the detection and feedback circuit 107, generating a detection signal and outputting a signal corresponding to the current to be measured, based on the detection signal. The excitation circuit 106 corresponds to a drive means of the invention. The detection and feedback circuit 107 and the output circuit 108 correspond to a measurement means of the invention.

The current sensor apparatus further comprises a shunt circuit 109 connected to the shunt coil 105. The shunt circuit 109 is provided for adjusting the cutoff frequency of the shunt coil 105. The shunt circuit 109 is, for example, a circuit connecting ends of the shunt coil 105 to each other through a resistor having a specific resistance including zero. When the resistance is zero, a short circuit is established between the ends of the shunt coil 105. The shunt coil 105 and the shunt circuit 109 correspond to an attenuation means of the invention.

An end of the detection coil 152 is connected to the output of the output circuit 108. An output 154 is connected to the other end of the detection coil 152. A measurement signal corresponding to the current to be measured is outputted from the output 154. The ends of the detection coil 152 are connected to each other through a shunt resistor (indicated with R in FIG. 9) 153. The shunt resistor 153 is provided for adjusting the cutoff frequency and the detection signal level of the detection coil 152. A frequency component of the detection signal of the detection coil 152 lower than the cutoff frequency defined by the shunt resistor 153 is attenuated. The cutoff frequency of the detection coil 152 is set at a frequency equal to or lower than the cutoff frequency of the shunt coil 105 and may be equal to the cutoff frequency of the shunt coil 105.

In this embodiment the cutoff frequency of the shunt coil 105 is set at a frequency equal to or lower than the Nyquist frequency obtained from the frequency of the excitation current. In the current sensor apparatus of the embodiment, a frequency component of the current to be measured equal to or lower than the cutoff frequency of the shunt coil 105 is detected at the magnetic sensor element, the detection and feedback circuit 107 and the output circuit 108. A frequency component of the current to be measured higher than the cutoff frequency of the shunt coil 105 is detected at the detection coil 152. The detection signal of the output circuit 108 and the detection signal of the detection coil 152 are added and the result is outputted from the output 154 as a measurement signal.

Figure 11:
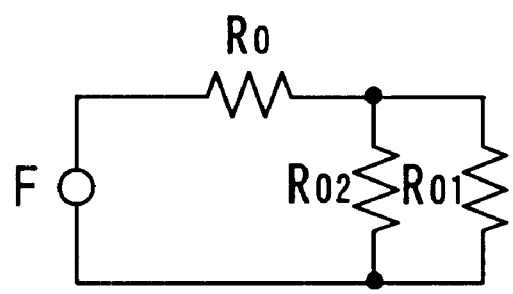
FIG. 11 is a circuit diagram of an equivalent circuit of the main part of the current sensor apparatus shown in FIG. 9.

In this embodiment the magnetic path of the flux passing through the yoke 102 is divided into the first magnetic path 201 and the second magnetic path 202. The reason that it is possible to measure a current although the magnetic path is divided as such will now be described. The magnetic path through which both the flux passing through the first magnetic path 201 and the flux passing through the second magnetic path 202 pass is hereinafter called a common magnetic path. The reluctance of the common magnetic path is indicated with R0. The common magnetic path is the yoke 102 in this embodiment. The reluctance of the first magnetic path 201 is R01. The reluctance of the second magnetic path 202 is R02. Magnetomotive force generated by the current passing through the current path 101 is F. The equivalent circuit of the main part of the current sensor apparatus of FIG. 10 is shown in FIG. 11. In the equivalent circuit reluctance R0 and a parallel circuit of reluctance R01 and reluctance R02 are connected in series to the source of magnetomotive force F.

Where a current to be measured is I (A), magnetomotive force F is represented by F=I (A/m). Magnetomotive force F1 applied to the first magnetic path 201 and magnetomotive force F2 applied to the second magnetic path 202 are represented by the following equation.

$$F1=F2=F \cdot (R01//R02)/(R01//R02+R0)$$

The reluctance of the parallel circuit of reluctance R01 and reluctance R02 is represented by R01//1 R02 wherein R01//R02=R01·R02/(R01+R02).

If reluctance R0 of the common magnetic path is small enough and the relation holds that R0<<R01//R02, F1=F2=F. That is, if reluctance R01 of the first magnetic path and reluctance R02 of the second magnetic path are sufficiently greater than reluctance R0 of the common magnetic path, magnetomotive force F1 applied to the first magnetic path 201 is equal to magnetomotive force F2 applied to the second magnetic path 202. This similarly applies to the case where the magnetic path is divided into three paths or more, regardless of the number of paths. In this embodiment each of the first magnetic path 201 and the second magnetic path 202 has a gap between the yoke 102 and each of the cores 103 and 151, respectively. Therefore, reluctance R01 and reluctance R02 are sufficiently greater than reluctance R0 of the common magnetic path.

As a result, although the magnetic path of the flux passing through the yoke 102 is divided into the first magnetic path 201 and the second magnetic path 202, it is possible to measure a current in each of the paths 201 and 202. It is possible to determine the properties such as the AL value of each of the paths 201 and 202 independently as long as the reluctance is maintained at a specific level.

The following is a method of determining the cutoff frequency of the shunt coil 105 and the cutoff frequency of the detection coil 152. The cutoff frequency of the shunt coil 105 is expressed by the following equation where the cutoff frequency of the shunt coil 105 is f1, the inductance is L1, the direct current resistance is r1, and the direct current resistance of the shunt resistor of the shunt circuit 109 is R1.

$$f1=(r1+R1)/2\pi \cdot L1$$

Consequently, f1 is 8 kHz where L1=0.1 $\mu$H, r1=5 m$\Omega$, and R1=0, for example. It is not difficult to make a coil having an inductance of 0.1 $\mu$H with a direct current resistance of 5 m $\Omega$ through the use of a copper foil for the conductor.

The cutoff frequency of the detection coil 152 is expressed by the following equation where the cutoff frequency of the detection coil 152 is f2, the inductance is L2, the direct current resistance is r2, and the direct current resistance of the shunt resistor 153 is R2.

$$f2=(r2+R2)/2\pi \cdot L2$$

If f2 is 8 kHz in accordance with the cutoff frequency of the shunt coil 105, it is required that (r2+R2) equals to 5 $\Omega$ where L2 is 100 $\mu$H. Since it is easy to make a coil having an inductance of 100 $\mu$H with a direct current resistance of 1 $\Omega$ or less, it is possible to define R2 as about 4 $\Omega$.

The following is a description of the reason that it is possible that the detection signal of the output circuit 108 and the detection signal of the detection coil 152 are added. To simplify the argument, the coupling coefficient between current I flowing through the current path 101 and the detection coil 152 is 1. The number of turns of the detection coil 152 is N. Output voltage E of the detection coil 152 is expressed by the following equation.

$$E=\{I \cdot (r2+R2)/N^2\} \cdot R2/(r2+R2)=I \cdot R2/N^2$$

Where I=100 (A), R2=4 $\Omega$, and N=10, E is 4 (V). Therefore, it is possible that output voltage E of the detection coil 152 is directly added to the output of the output circuit 108.

Since it is required that the AL value of the second magnetic path 202 passing through the detection coil 152 is 1 $\mu$H/T, the length of the gap between the core 151 and the yoke 102 is about 1 mm.

The operation of the current sensor apparatus of the embodiment will now be described. In the apparatus a current passing through the current path 101 generates a magnetic flux passing through the magnetic yoke 102. A part of the flux passing through the yoke 102 passes through the first magnetic path 201. Another part of the flux passes through the second magnetic path 202.

The magnetic sensor element includes the sensor magnetic core 103 and the sensor coil 104 provided in the first magnetic path 201. In order to measure a current flowing through the current path 101, the magnetic sensor element detects a magnetic field in gap G generated by the current flowing through the current path 101. To be specific, the excitation circuit 106 supplies an alternating excitation current that drives the core 103 into a saturation region to the sensor coil 104. The detection and feedback circuit 107 detects the current flowing through the sensor coil 104 so as to detect variations in inductance of the sensor coil 104, and outputs a signal corresponding to the variations in the inductance. The detection and feedback circuit 107 also generates a negative feedback current used for negative feedback of the signal to the sensor coil 104 and supplies the negative feedback current to the sensor coil 104. The output circuit 108 generates a signal corresponding to the current to be measured, based on the detection signal of the detection and feedback circuit 107. In such a manner the current is measured through the use of the magnetic sensor element provided in the first magnetic path 201 wherein both the large amplitude excitation method and the negative feedback method are utilized.

The shunt coil 105 provided in the first magnetic path 201 attenuates a frequency component of the magnetic flux passing through the first magnetic path 201 that exceeds the specific cutoff frequency. Therefore, the output signal of the output circuit 108 corresponds to the frequency component of the current to be measured that is equal to or less than the cutoff frequency of the shunt coil 105.

The cutoff frequency of the shunt coil 105 is set at a frequency equal to or less than the Nyquist frequency obtained from the excitation current. As a result, it is possible to prevent application of a magnetic field having a frequency higher than the Nyquist frequency that may cause a beat to the sensor coil 102.

Through the AC coupling method the detection coil 152 provided in the second magnetic path 202 detects a frequency component of the current to be measured flowing through the current path 101 that exceeds the cutoff frequency. The detection signal of the output circuit 108 and the detection signal of the detection coil 152 are then added and the result is outputted from the output 154 as a measurement signal.

According to the current sensor apparatus of the embodiment thus described, the current is measured through the combination of the magnetic sensor including the core 103 and the sensor coil 104, and the detection coil 152. As a result, the response frequency band is widened.

In the prior-art current sensor apparatus utilizing the AC coupling method, the magnetic sensor element and the coil for detecting a high frequency component are placed in the one magnetic path. As a result, a problem that it is impossible to measure a high frequency component arises if a means is provided in the magnetic path for attenuating a high frequency component in order to prevent generation of a beat due to the frequency of a varying component of the current to be measured and the excitation frequency.

In the current sensor apparatus of the embodiment, in contrast, the magnetic sensor element and the detection coil 152 are placed in the different magnetic paths. As a result, it is possible to determine the cutoff frequency and so on independently for each of the magnetic paths. It is thereby possible to widen the response frequency band as well as prevent generation of a beat due to the frequency of a varying component of the current to be measured and the excitation frequency.

According to the embodiment, since the magnetic sensor element and the detection coil 152 are placed in the different magnetic paths, the degrees of freedom of processing and arrangement of the detection coil 152 are increased and it is easy to manufacture the current sensor apparatus utilizing the AC coupling method.

According to the embodiment, since the magnetic sensor element and the detection coil 152 are placed in the different magnetic paths, the AL value of the second magnetic path 202 where the detection coil 152 is located may be determined independently of the AL value of the first magnetic path 201 where the magnetic sensor element is located. As a result, it is possible to prevent an increase of the current sensor apparatus in size and price.

According to the current sensor apparatus of the embodiment thus described, the response frequency band is widened while it is possible to prevent generation of a beat due to the frequency of a varying component of the current to be measured and the excitation frequency, to reduce difficulties in manufacturing the apparatus and to avoid an increase in size. Such a current sensor apparatus is very effective for measuring or controlling a large direct current in an electric car or a solar-power generation apparatus and so on, and makes a great contribution to responding to social demands such as the need for solving environmental problems.

[Fifth Embodiment]

Figure 12:
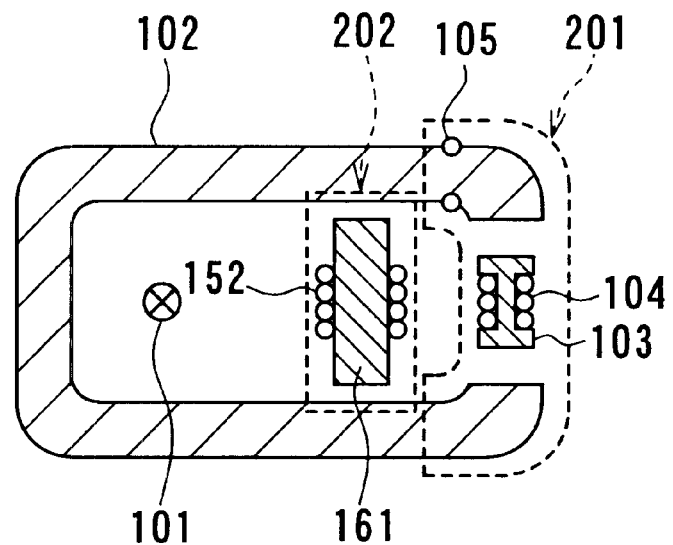
FIG. 12 is a cross-sectional view of the main part of a current sensor apparatus of a fifth embodiment of the invention.

FIG. 12 is a cross section of the main part of a current sensor apparatus of a fifth embodiment of the invention. In the apparatus the detection coil 152 is not placed in the gap of the magnetic yoke 102 where the magnetic sensor element including the core 103 and the sensor coil 104 is only placed.

The current sensor apparatus of this embodiment comprises a magnetic field interrupting member 161 placed between the current path 101 and the gap of the yoke 102. The field interrupting member 161 interrupts a magnetic field corresponding to a magnetic flux that is generated by a current flowing through the current path 101 and does not pass through the yoke 102, so that the magnetic field is cut off from the magnetic sensor element. A gap having a specific length is provided between the inner surface of the yoke 102 and each of the ends of the field interrupting member 161. The field interrupting member 161 is made of a magnetic substance. In the current sensor apparatus of the embodiment the detection coil 152 is wound around the field interrupting member 161.

In the embodiment the magnetic path of the flux passing through the portion of the yoke 102 closer to the current path 101 than the member 161 (that is, the left side of FIG. 12) is divided into: the first magnetic path 201 passing through the magnetic sensor element including the core 103 and the sensor coil 104; and the second magnetic path 202 passing through the field interrupting member 161. The first magnetic path 201 includes the portion of the yoke 102 closer to the magnetic sensor element than the member 161 (that is, the right side of FIG. 12).

In the embodiment the shunt coil 105 is wound around the portion of the yoke 102 closer to the magnetic sensor element than the member 161. In this manner the shunt coil 105 is placed in the first magnetic path 201.

In a current sensor apparatus in which the yoke 102 is placed around the current path 101 and the magnetic sensor element is placed in the gap of the yoke 102, the effect of the magnetic field corresponding to the flux that is generated by the current flowing through the current path 101 and does not pass through the yoke 102 on the magnetic sensor element changes if the position of the current path 101 changes. Therefore, the current sensor apparatus having such a configuration has a problem that measurement errors result from variations in the position of the current path 101.

In the embodiment, in contrast, the field interrupting member 161 interrupts the magnetic field corresponding to the flux that is generated by the current flowing through the current path 101 and does not pass through the yoke 102, so that the field is cut off from the magnetic sensor element. As a result, it is possible to reduce measurement errors resulting from variations in the position of the current path 101 passing through the space inside the yoke 102.

According to the current sensor apparatus of the embodiment thus described, it is possible to reduce measurement errors resulting from variations in the position of the current path 101 passing through the space inside the magnetic yoke 102, without sacrificing the convenience of use of the apparatus in that a current is measured by simply passing the electric wire through the space inside the yoke 102, and without increasing the apparatus in size and weight.

According to the embodiment, the detection coil 152 and the shunt coil 105 are additionally provided in the current sensor apparatus comprising the field interrupting member 161. As a result, the response frequency band is easily widened through the use of the AC coupling method.

The remainder of configuration, operation and effects of the fifth embodiment are similar to those of the fourth embodiment.

[Sixth Embodiment]

Figure 13:
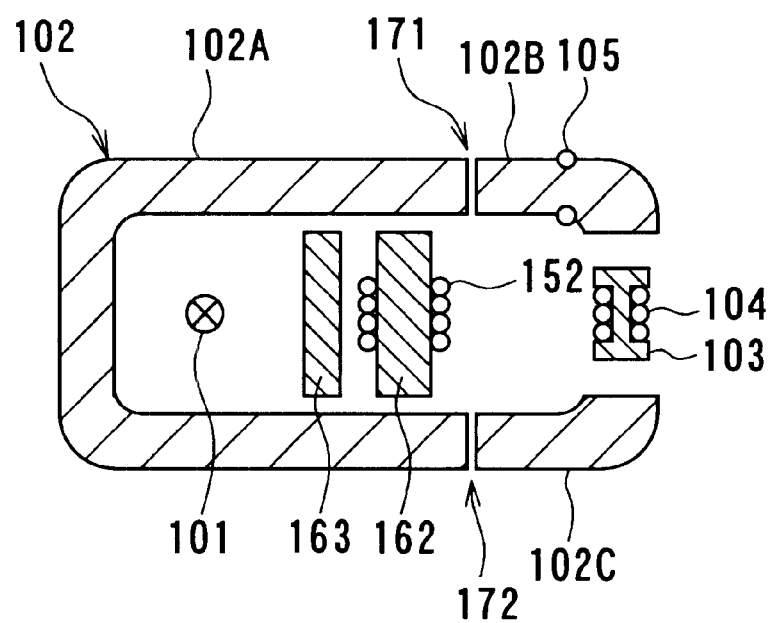
FIG. 13 is a cross-sectional view of the main part of a current sensor apparatus of a sixth embodiment of the invention.

FIG. 13 is a cross section of the main part of a current sensor apparatus of a sixth embodiment of the invention. In the apparatus, as in the fifth embodiment, the detection coil 152 is not placed in the gap of the magnetic yoke 102 where the magnetic sensor element including the core 103 and the sensor coil 104 is only placed.

In the current sensor apparatus of this embodiment a magnetic core 162 is provided between the current path 101 and the gap of the yoke 102. The detection coil 152 is wound around the core 162. A gap having a specific length is provided between the inner surface of the yoke 102 and each of the ends of the core 162.

The current sensor apparatus further comprises a magnetic field interrupting member 163 placed between the current path 101 and the detection coil 152. The field interrupting member 163 interrupts a magnetic field corresponding to a magnetic flux that is generated by a current flowing through the current path 101 and does not pass through the yoke 102, so that the magnetic field is cut off from the detection coil 152. A gap having a specific length is provided between the inner surface of the yoke 102 and each of the ends of the field interrupting member 163. The field interrupting member 163 is made of a magnetic substance.

In the embodiment the magnetic path of the flux passing through a portion of the yoke 102 closer to the current path 101 than the member 163 (that is, the left side of FIG. 13) is divided into: a first magnetic path passing through the magnetic sensor element including the core 103 and the sensor coil 104; a second magnetic path passing through the core 162 and the detection coil 152; and a third magnetic path passing through the field interrupting member 163. The first magnetic path includes the portion of the yoke 102 closer to the magnetic sensor element than the core 162 (that is, the right side of FIG. 13).

In the embodiment the field interrupting member 163 interrupts the magnetic field corresponding to the flux that is generated by the current flowing through the current path 101 and does not pass through the yoke 102, so that the field is cut off from the detection coil 152 and the magnetic sensor element. As a result, it is possible to reduce measurement errors resulting from variations in the position of the current path 101 passing through the space inside the yoke 102.

In the embodiment the yoke 102 is separable into a portion 102A close to the current path 101, and portions 102B and 102C close to the gap at sections 171 and 172. As a result, it is easy to assemble the main part of the current sensor apparatus shown in FIG. 13.

The sections 171 and 172 are provided in a portion closer to the magnetic sensor element than the core 162, that is, in the first magnetic path. Since the gap in the first magnetic path is greater than the gap in each of the second and third paths, the reluctance of the first path is greater than that of each of the second and third paths. Therefore, if the sections 171 and 172 are provided in the first magnetic path as in this embodiment, variations in the reluctance of the first magnetic path where the magnetic sensor element is placed are made smaller even if the gap in the sections 171 and 172 vary, compared to the case in which the sections 171 and 172 are provided in the other magnetic paths.

The field interrupting member 163 similar to that of the sixth embodiment may be provided between the detection coil 152 and the current path 101 in the fourth or fifth embodiment, too.

The remainder of configuration, operation and effects of the sixth embodiment are similar to those of the fourth embodiment.

[Seventh Embodiment]

Figure 14:
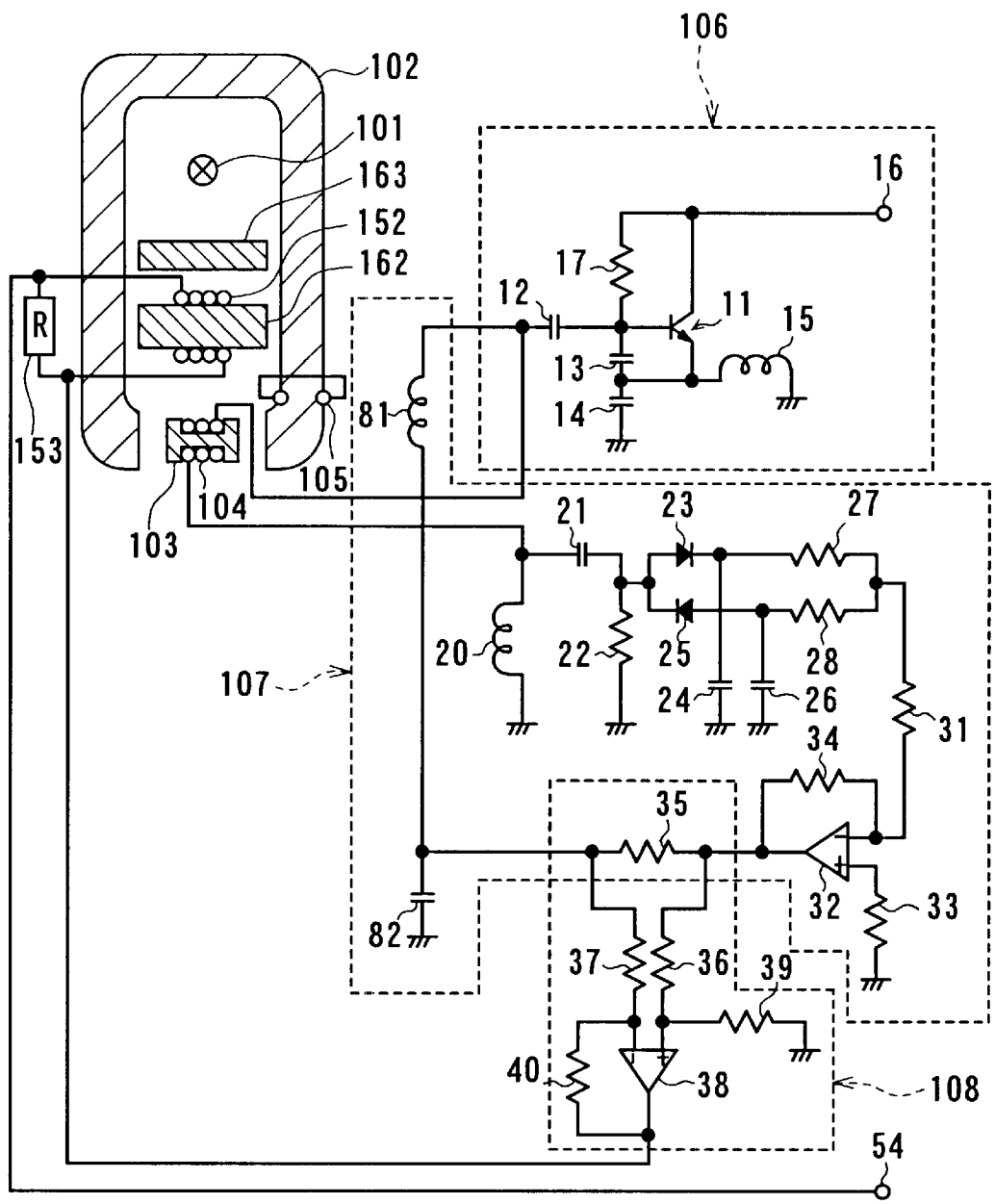
FIG. 14 is a circuit diagram illustrating the configuration of a current sensor apparatus of a seventh embodiment of the invention.

A current sensor apparatus of a seventh embodiment of the invention will now be described. FIG. 14 is a circuit diagram of the current sensor apparatus. The arrangement of the yoke 102, the core 103, the sensor coil 104, the shunt coil 105, the core 162, the detection coil 152 and the field interrupting member 163 of this embodiment is similar to that of the sixth embodiment, except that the yoke 102 is not separable.

The circuit configuration of the current sensor apparatus of the seventh embodiment will now be described. Positive and negative power supply circuits for operational amplifiers are not shown, according to the practice.

The excitation circuit 106 has a series resonant circuit part of which is made up of the sensor coil 104 and supplies a resonant current flowing through the series resonant circuit, as an excitation current for driving the core 103 into a saturation region, to the sensor coil 104. The configuration of the excitation circuit 106 is as follows. The excitation circuit 106 incorporates the transistor 11. The base of the transistor 11 is connected to an end of the sensor coil 104 through the capacitor 12 used for resonance. An end of the capacitor 13 used for feedback is connected to the base of the transistor 11. An end of the capacitor 14 used for feedback and the emitter of the transistor 11 are connected to the other end of the capacitor 13. The other end of the capacitor 14 is grounded. The emitter of the transistor 11 is grounded through the load coil 15. The collector of the transistor 11 is connected to the power input 16 and to the base through the bias resistor 17. This configuration is that of a Clapp oscillation circuit wherein Cs<<Cb and Cs<<Ce, the capacitance of each of the capacitors 12, 13 and 14 being Cs, Cb and Ce, respectively.

The detection and feedback circuit 107 has a configuration as follows. The detection and feedback circuit 107 has the detection coil 20 an end of which is connected to the other end of the sensor coil 104. The other end of the detection coil 20 is grounded. The detection coil 20 corresponds to an inductance element of the invention. An end of a coil 81 making a path for supplying a negative feedback current to the sensor coil 104 is connected to the one end of the sensor coil 104. The other end of the coil 81 is grounded through a capacitor 82.

An end of the capacitor 21 is connected to the connection point between the sensor coil 104 and the detection coil 20. The other end of the capacitor 21 is grounded through the resistor 22. The capacitor 21 and the resistor 22 make up a differentiation circuit for differentiating the voltage generated across the coil 20 and outputting a signal corresponding to the current to be measured flowing through the current path 101.

The anode of the diode 23 and the cathode of the diode 25 are connected to the connection point between the capacitor 21 and the resistor 22. The cathode of the diode 23 is grounded through the capacitor 24. The anode of the diode 25 is grounded though the capacitor 26. The diode 23 and the capacitor 24 make up the positive peak hold circuit. The diode 25 and the capacitor 26 make up the negative peak hold circuit.

An end of the resistor 27 is connected to the connection point between the diode 23 and the capacitor 24. An end of the resistor 28 is connected to the connection point between the diode 25 and the capacitor 26. The other end of each of the resistors 27 and 28 is connected to an end of the resistor 31. The resistors 27 and 28 make up the resistor adding circuit for adding a positive output value held at the positive peak hold circuit to a negative output value held at the negative peak hold circuit. A detection signal corresponding to the current to be measured is present at an end of the resistor 31.

The other end of the resistor 31 is connected to the inverting input of the operational amplifier 32. The noninverting input of the operational amplifier 32 is grounded through the resistor 33. The output of the operational amplifier 32 is connected to the inverting input through the resistor 34. The amplifier 32 and the resistors 31, 33 and 34 make up an inverting amplifier.

The output of the operational amplifier 32 is connected to an end of the resistor 35 for detecting an output. The other end of the resistor 35 is connected to the connection point between the coil 81 and a capacitor 82.

The detection coil 20, the coil 81 and the capacitor 82 are part of the excitation circuit 106, too.

The configuration of the output circuit 108 is as follows. The connection point between the resistor 35 and the output of the amplifier 32 is connected to the noninverting input of the operational amplifier 38 through the resistor 36. The connection point between the resistor 35 and the coil 81 is connected to the noninverting input of the amplifier 38 through the resistor 37. The noninverting input of the amplifier 38 is grounded through the resistor 39. The output of the amplifier 38 is connected to the inverting input through the resistor 40 and to an end of the shunt resistor 153. The amplifier 38 and the resistors 36, 37, 39 and 40 make up a differential amplifier. The resistor 35 is part of the detection and feedback circuit 107, too.

The operation of the current sensor apparatus of the embodiment will now be described. An alternating excitation current is supplied to the sensor coil 104 by the excitation circuit 106 such that the core 103 is driven into the saturation region. The excitation current is a resonant current that is equal to the current value limited by the supply voltage multiplied by value Q of the resonant circuit. A method taken in this embodiment is to detect variations in waveform of resonant current as a method of capturing variations in inductance of the sensor coil 104 as a detection signal of the current sensor apparatus. To be specific, the voltage across the detection coil 20 connected to the sensor coil 104 in series and having a large saturation current is differentiated at the differentiation circuit made up of the capacitor 21 and the resistor 22. A positive output value of an output of the differentiation circuit is held at the positive peak hold circuit made up of the diode 23 and the capacitor 24. A negative output value of the output of the differentiation circuit is held at the negative peak hold circuit made up of the diode 25 and the capacitor 26. The positive and negative output values are added at the resistor adding circuit made up of the resistors 27 and 28. A detection signal corresponding to the current to be measured is thus obtained.

When no external magnetic field generated by the current to be measured is present, the positive and negative portions of the differential waveform of the voltage across the detection coil 20 are symmetric, and the sum of positive and negative peak values (the difference between the absolute values) of the differential waveform is zero. In contrast, when the external field generated by the current to be measured is applied to the sensor coil 104, the positive and negative portions of the differential waveform are asymmetric. As a result, the sum of positive and negative peak values (the difference between the absolute values) of the differential waveform is other than zero, which depends on the external magnetic field. The asymmetric components of the differential waveform are detected as a voltage signal through differentiating the excitation current waveform twice by the detection coil 20 and the differentiation circuit. According to the embodiment, in such a manner, the current is measured by obtaining the sum of positive and negative peak values (the difference between the absolute values) of the differential waveform.

As thus described, the detection and feedback circuit 107 detects the current to be measured, based on the portion of the resonant current flowing through the sensor coil 104 that drives the core 103 into the saturation region.

The detection signal obtained at the adding circuit made up of the resistors 27 and 28 is inverted and amplified at the inverting amplifier made up of the operational amplifier 32 and the resistors 31, 33 and 34. The signal is then carried through the resistor 35 and applied to the connection point between the coil 81 and the capacitor 82. A negative feedback current is thereby supplied to the sensor coil 104 through the coil 81, and magnetomotive force in the direction opposite to the external magnetic field is applied to the sensor coil 104.

The current is measured as follows. The negative feedback current, that is, the current corresponding to the external field, is converted to a voltage by the resistor 35. The voltage is amplified at the differential amplifier made up of the operational amplifier 38 and the resistors 35, 36, 39 and 40, and then outputted as a detection signal of the output circuit 108. The detection signal of the output circuit 108 is added to the detection signal of the detection coil 152 and outputted from the output 54 as a measurement signal.

A specific example of the current sensor apparatus actually fabricated will now be described. In this example, the yoke 102 and the core 162 each have a cross section of 5 mm by 5 mm. The field interrupting member 163 has a cross section of 5 mm by 3 mm. The yoke 102, the core 162 and the field interrupting member 163 are all made of Mn—Zn-base ferrite. The total length of the gaps between the yoke 102 and each of the ends of the core 162 is 1 mm. The total length of the gaps between the yoke 102 and each of the ends of the field interrupting member 163 is 1 mm, too. The coil 152 is made of 10 turns of urethane-coated lead wire having a diameter of 0.3 mm. The resistance of the shunt resistor 153 is 4 Ω. The shunt coil 105 is shorted at the resistance of zero.

The core 103 is made of Ni—Cu—Zn-base ferrite and a drum-shaped core having a diameter of 0.8 mm and a length of 1.5 mm and having a brim of 2 mm in diameter and 0.5 mm in thickness. The sensor coil 104 is made of 180 turns of urethane-coated lead wire having a diameter of 0.03 mm.

In this example the excitation frequency of the sensor coil 104 is 200 kHz. Each of the cutoff frequency of the shunt coil 105 and the cutoff frequency of the detection coil 152 is 8 kHz. A frequency component of the output signal of the sensor coil 104, wherein a high frequency component is cut off by the shunt coil 105, that is higher than the cutoff frequency of 8 kHz sufficiently lower than the Nyquist frequency is attenuated. As a result, generation of a beat due to the frequency of a varying component of the current to be measured and the excitation frequency is prevented. In this example the response frequency band of the measurement signal outputted from the output 54 is 0 to 100 kHz. The upper limit of the response frequency results from the eddy current loss caused by the low resistivity of the magnetic yoke 102.

According to the embodiment, a resonant current of the resonant circuit is supplied to the sensor coil 104. As a result, an alternating excitation current that drives the core 103 into the saturation region is easily supplied to the sensor coil 104.

According to the embodiment, the negative feedback current used for the negative feedback method is supplied to the sensor coil 104 through the coil 81 connected to the sensor coil 104 in parallel in terms of alternating current. As a result, the feedback current is easily supplied to the coil 104 without causing a loss of resonant current.

According to the embodiment, a detection output of the order of volts is easily obtained by inserting the detection coil 20 to the resonant circuit, without reducing value Q of the resonant circuit, that is, without causing insufficiency in resonant current supplied to the sensor coil 104. In addition, the peak hold circuit is implemented by the simple and inexpensive one utilizing the diode and the capacitor. The detection coil 20 is able to obtain a sufficiently large output even when the inductance value thereof is a few percent of the inductance value of the coil 104. Therefore, since the number of turns of the detection coil 20 is small and the saturation current value is sufficiently large in general, the detection coil 20 will not be saturated by the drive current (resonant current) of the coil 104.

Through those techniques, the large amplitude method and the negative feedback method are applicable while a magnetic core, such as a ferrite core, having a large saturation field and large nonlinearity is used. It is thereby possible to use a fluxgate element for detecting a large magnetic field or a large electric current.

The features of the current sensor apparatus of the embodiment are listed below.
(1) Measurement errors resulting from variations in the position of the current path through which a current to be measured passes are small.
(2) Since the negative feedback method is taken, sensitivity variations are reduced and thermal characteristics are improved automatically.
(3) Thus, no sensitivity adjustment or thermal characteristic compensation is required.
(4) No offset adjustment is required.
(5) The apparatus exhibits excellent properties since the large amplitude excitation method is applied.
(6) No special method is required for fabricating the sensor section.
(7) Since resonant current is utilized, the sensor coil is driven at a low supply voltage and a high frequency.
(8) No special material or method is required for fabricating the apparatus and the circuit is very simple. As a result, the apparatus is manufactured at an extremely low cost and it is possible to meet the great demand.
(9) The apparatus has an excellent frequency response.
(10) Power consumption is low since resonant current is used.
(11) The apparatus is small and light-weight since the configuration is simple.

The remainder of configuration, operation and effects of the seventh embodiment are similar to those of the fourth or sixth embodiment.

[Eighth Embodiment]

Figure 15:
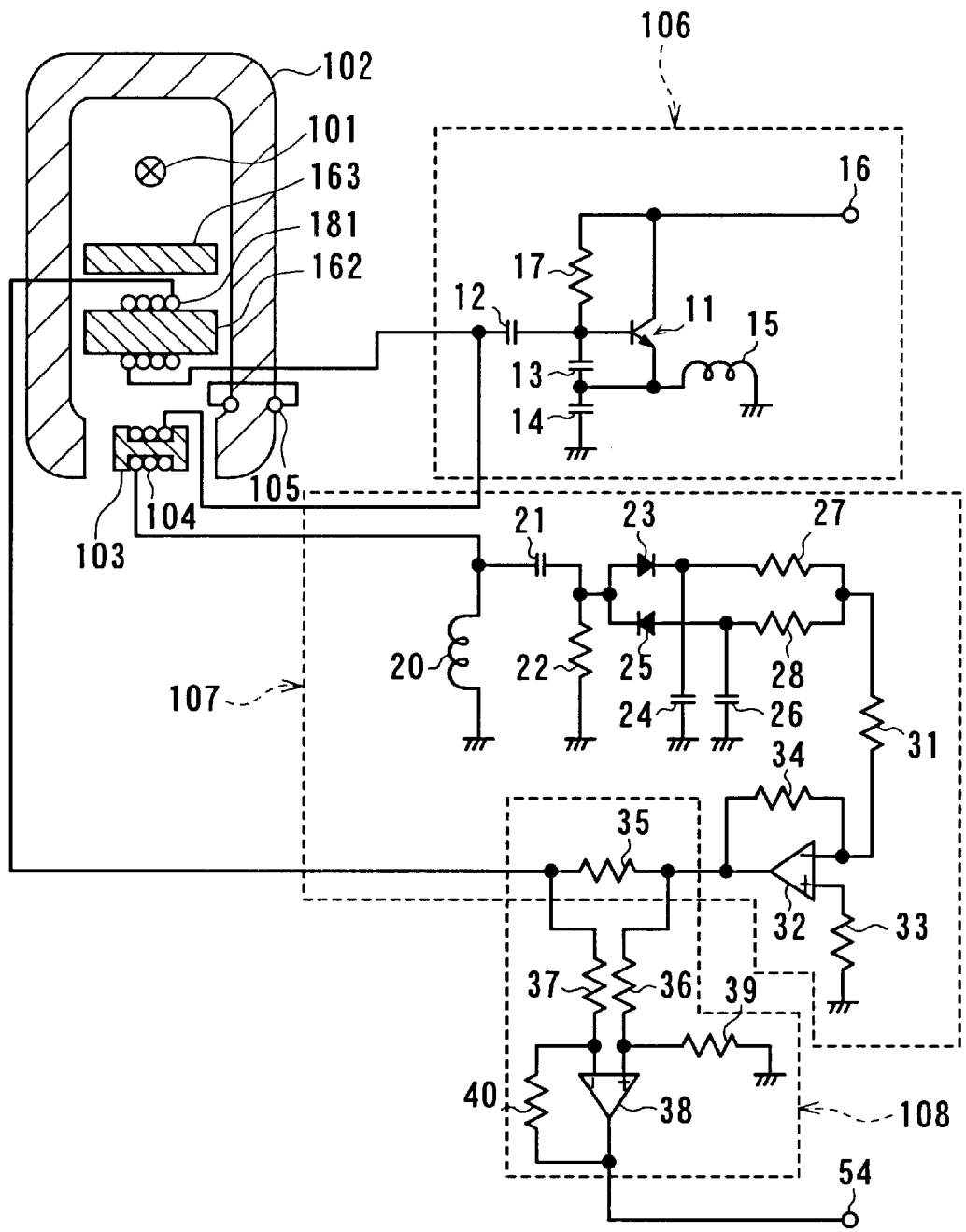
FIG. 15 is a circuit diagram illustrating the configuration of a current sensor apparatus of an eighth embodiment of the invention including a magnetic yoke.
Figure 16:
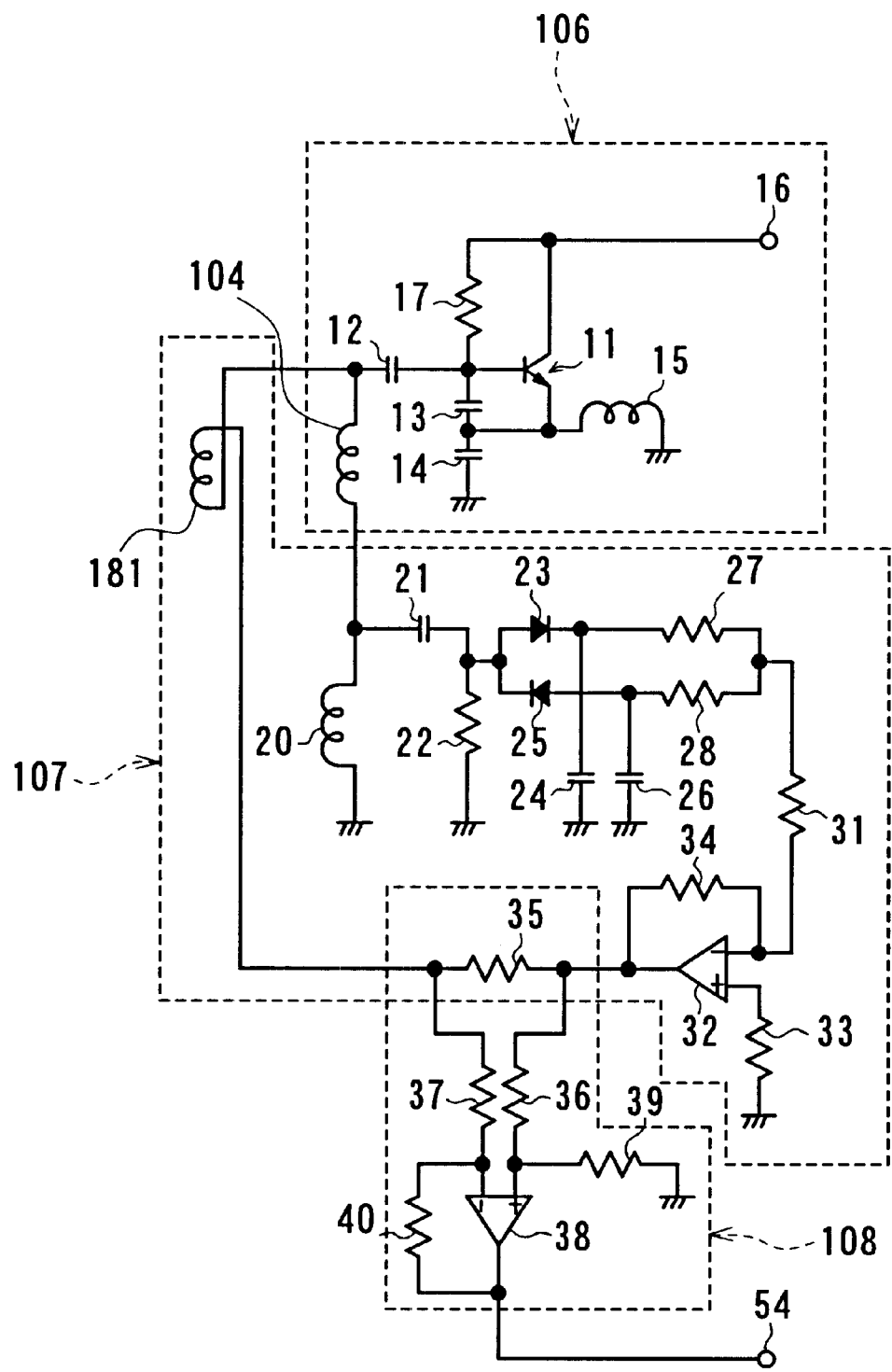
FIG. 16 is a circuit diagram illustrating the configuration of the current sensor apparatus of the eighth embodiment except the magnetic yoke.
Figure 17:
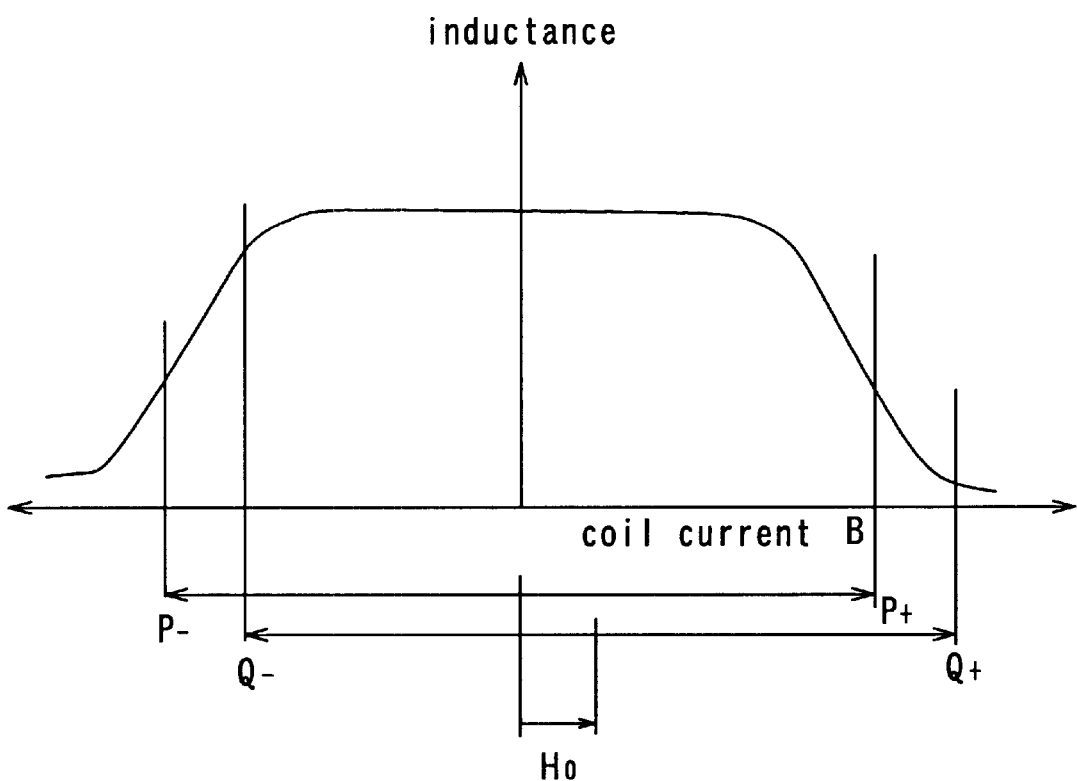
FIG. 17 is an explanatory view for describing the operation principle of a fluxgate element.

A current sensor apparatus of an eighth embodiment of the invention will now be described. FIG. 15 is a circuit diagram illustrating the configuration of the current sensor apparatus including the magnetic yoke. FIG. 16 is a circuit diagram illustrating the configuration of the current sensor apparatus except the magnetic yoke. In the apparatus of the eighth embodiment the arrangement of the yoke 102, the core 103, the sensor coil 104, the shunt coil 105, the core 162, and the field interrupting member 163 is similar to that of the seventh embodiment.

The circuit configuration of the current sensor apparatus of the eighth embodiment will now be described. In this embodiment the detection coil 152 and the shunt resistor 153 of the seventh embodiment are not provided. The output 54 is connected to the output of the operational amplifier 38.

In this embodiment, a coil 181 making a path for supplying a negative feedback current to the sensor coil 104 is wound around the core 162, in place of the coil 152 of the seventh embodiment. An end of the coil 181 is connected to an end of the sensor coil 104. The other end of the coil 181 is connected to the connection point between the resistors 35 and 37 of the output circuit 108.

In the eighth embodiment, the coil 181 is placed in the second magnetic path. Therefore, a high frequency current corresponding to a high frequency component of the current to be measured flowing through the current path 101 is induced at the coil 181. That is, the coil 181 of this embodiment functions as a coil for detecting a high frequency component, too. As shown in FIG. 16, when seen from the series circuit of the sensor coil 104 and the coil 181, the coil 181 is placed such that the polarity of a current induced at the coil 181 by the external magnetic field is equal to the polarity of a current induced at the sensor coil 104 by the external magnetic field. That is, a high frequency component of the current induced at the coil 181 is added to a high frequency component of the current induced at the sensor coil 104 in the series circuit of the sensor coil 104 and the coil 181.

The coil 181 is connected to the resistor 35 of the output circuit 108. Therefore, the high frequency current induced at the coil 181 produces a potential across the resistor 35. The potential corresponds to the high frequency component of the current to be measured. At the output circuit 108 the detection signal of the fluxgate magnetic sensor element is thus added to the signal corresponding to the high frequency component of the current to be measured, and the result is outputted as a measurement signal from the output 54.

According to the embodiment, the coil 181 functions as the coil for detecting a high frequency component, too. As a result, the response frequency band is widened while the configuration of the apparatus is simple and the negative feedback method is applied.

The remainder of configuration, operation and effects of the second embodiment are similar to those of the seventh embodiment.

According to the current sensor apparatus of the invention including the fourth to eighth embodiments, the magnetic sensor element and the coil for detecting a high frequency component are placed in the different first and second magnetic paths. As a result, it is possible to determine the cutoff frequency and so on for each of the magnetic sensor element and the coil for detecting a high frequency component independently. It is thereby possible to widen the response frequency band while generation of a beat due to the frequency of a varying component of the current to be measured and the excitation frequency is prevented, and difficulties in manufacturing the apparatus and an increase in size are reduced.

If the attenuation means is provided for attenuating a frequency component that exceeds a specific cutoff frequency of the magnetic flux passing through the first magnetic path, it is possible to prevent application of a magnetic field having a frequency that may generate a beat to the magnetic sensor element.

The magnetic sensor element having the magnetic core and the sensor coil wound around the core may be used, and the attenuation means may be provided for attenuating a frequency component that exceeds a specific cutoff frequency of the magnetic flux passing through the first magnetic path, wherein the cutoff frequency is equal to or less than the Nyquist frequency obtained from the frequency of the excitation current of the sensor coil. In this case, it is possible to prevent application of a magnetic field having a frequency higher than the Nyquist frequency that may generate a beat to the magnetic sensor element.

The second magnetic path may be placed between the current path and the first magnetic path, and the field interrupting member may be placed in the second magnetic path around which the coil for detecting a high frequency component is wound. In this case, it is possible to interrupt the magnetic field corresponding to the flux that is generated by the current flowing through the current path and does not pass through the magnetic yoke. It is thereby possible to reduce measurement errors resulting from variations in the position of the current path passing through the space inside the yoke.

The path for supplying a negative feedback current to the sensor coil may be formed and the coil for detecting a high frequency component of the current to be measured may be placed in the second magnetic path. In this case, the response frequency band is widened while the configuration of the apparatus is simple and the negative feedback method is applied.

According to the current sensor apparatus of the invention including the first to eighth embodiments, the magnetic path of the flux passing through the yoke includes: the first magnetic path, mainly passing through the magnetic sensor element, through which a part of the magnetic flux passing through the yoke passes; and the second magnetic path through which another part of the magnetic flux passing through the yoke passes. As a result, through the use of the second magnetic path, it is possible to achieve other functions such as interrupting the field corresponding to the flux not passing through the yoke so that the field is cut off from the magnetic sensor element, or detecting a high frequency component of the current.

The invention is not limited to the foregoing embodiments but may be practiced in still other ways. For example, the invention is not limited to the current sensor apparatus incorporating a fluxgate element as the magnetic sensor element but may be applied to a current sensor apparatus incorporating any other element such as a Hall element as the magnetic sensor element.

Although the Clapp oscillation circuit is used as an example of the oscillation circuit in the foregoing embodiments, the invention is not limited to the circuit but may be applied to cases where any other oscillation circuit such as a Colpitts oscillation circuit or a Hartley oscillation circuit is utilized.

Obviously many modifications and variations of the present invention are possible in the light of the above teachings. It is therefore to be understood that within the scope of the appended claims the invention may be practiced otherwise than as specifically described.

What is claimed is:

1. A current sensor apparatus, comprising:
   a ring-shaped magnetic yoke through which a magnetic flux generated by an electric current flowing through an electric current path passes, the yoke surrounding the electric current path, part of the yoke having a gap;
   a magnetic sensor element placed in the gap of the magnetic yoke and provided for detecting a magnetic field in the gap generated by the current flowing through the current path;
   a magnetic field interrupter, placed between the current path and the gap, for interrupting a magnetic field corresponding to a magnetic flux that is generated by the current passing through the current path and does not pass through the magnetic yoke, so that the magnetic field is cut off from the magnetic sensor element; and
   a first magnetic path and a second magnetic path, through which the magnetic flux passing through the magnetic yoke passes divergently, wherein
   the first magnetic path passes through the magnetic sensor element, and the second magnetic path passes through the magnetic field interrupter.

2. The current sensor apparatus according to claim 1 wherein the field interrupter is separated from the magnetic yoke.

3. The current sensor apparatus according to claim 1 wherein the field interrupter is integrated with the magnetic yoke.

4. The current sensor apparatus according to claim 3, wherein part of the field interrupter has another gap.

5. The current sensor apparatus according to claim 4, wherein a center position of the gap of the field interrupter is disposed offset from a straight line drawn through a center of the current path and a center of the gap of the magnetic yoke as viewed in cross-section.

6. The current sensor apparatus according to claim 1 wherein the field interrupter is made of a magnetic substance.

7. The current sensor apparatus according to claim 1 wherein the magnetic sensor element is a fluxgate magnetic sensor element.

8. A current sensor apparatus, comprising:
   a ring-shaped magnetic yoke through which a magnetic flux generated by an electric current flowing through an electric current path passes, the yoke surrounding the electric current path, part of the yoke having a gap;
   a magnetic sensor element placed in the gap of the magnetic yoke and provided for detecting a magnetic field in the gap generated by the current flowing through the current path;
   a high frequency component detection coil for detecting a high frequency component of the current flowing through the current path; and
   a first magnetic path and a second magnetic path, through which the magnetic flux passing through the magnetic yoke passes divergently, wherein
   the first magnetic path passes through the magnetic sensor element, and the second magnetic path passes through the high frequency component detection coil.

9. The current sensor apparatus according to claim 8, further comprising an attenuation means for attenuating a frequency component of the magnetic flux passing through the first magnetic path that is higher than a specific cutoff frequency.

10. The current sensor apparatus according to claim 8 wherein the magnetic sensor element has a magnetic core placed in the gap and a sensor coil wound around the core and provided for detecting a magnetic field corresponding to the flux passing through the first magnetic path.

11. The current sensor apparatus according to claim 10, further comprising: a drive means for driving the sensor coil by supplying an alternating excitation current that drives the core into a saturation region to the sensor coil; and a measurement means for measuring the current passing through the current path by detecting variations in inductance of the sensor coil.

12. The current sensor apparatus according to claim 11, further comprising an attenuation means for attenuating a frequency component of the magnetic flux passing through the first magnetic path that is higher than a specific cutoff frequency, wherein the cutoff frequency is equal to or lower than a Nyquist frequency obtained from a frequency of the excitation current.

13. The current sensor apparatus according to claim 11 wherein the drive means has a series resonant circuit part of which is made up of the sensor coil and supplies a resonant current flowing through the series resonant circuit as the excitation current to the sensor coil.

14. The current sensor apparatus according to claim 11, further comprising a current supply means for supplying an electric current to the sensor coil, the current including a direct current and having a frequency different from a frequency of the excitation current.

15. The current sensor apparatus according to claim 14 wherein the current supply means supplies a negative feedback current to the sensor coil for negative feedback of an output of the measurement means to the sensor coil.

16. The current sensor apparatus according to claim 15 wherein the high frequency component detection coil forms a path for supplying the negative feedback current to the sensor coil.

17. The current sensor apparatus according to claim 11 wherein the measurement means has: an inductance element connected to the sensor coil in series; and a differentiation circuit for differentiating a voltage generated across the inductance element and outputting a signal responsive to the current flowing through the current path.

18. The current sensor apparatus according to claim 8, wherein the second magnetic path includes another gap.

19. The current sensor apparatus according to claim 8 wherein the second magnetic path is located between the current path and the first magnetic path.

20. The current sensor apparatus according to claim 10, further comprising a magnetic field interrupting member made of a magnetic substance and placed between the current path and the first magnetic path, the member interrupting a magnetic field corresponding to a magnetic flux that is generated by the current passing through the current path and does not pass through the magnetic yoke, so that the magnetic field is cut off from the magnetic sensor element, wherein the high frequency component detection coil is wound around the field interrupting member.

21. A current sensor apparatus comprising:

a ring-shaped magnetic yoke through which a magnetic flux generated by an electric current flowing through an electric path passes, the yoke surrounding the current path, part of the yoke having a gap;

a magnetic sensor element placed in the gap of the magnetic yoke and provided for detecting a magnetic field in the gap generated by the current flowing through the current path; and a magnetic field interrupter, placed between the current path and the gap, for interrupting a magnetic field corresponding to a magnetic flux that is generated by the current passing through the current path and does not pass through the magnetic yoke, so that the magnetic field is cut off from the magnetic sensor element.

22. The current sensor apparatus according to claim 21 wherein the field interrupter is separated from the magnetic yoke.

23. The current sensor apparatus according to claim 21 wherein the field interrupter is integrated with the magnetic yoke.

24. The current sensor apparatus according to claim 23 wherein part of the field interrupter has another gap.

25. The current sensor apparatus according to claim 24 wherein a center position of the gap of the field interrupter is disposed offset from a straight line drawn through a center of the current path and a center of the gap of the magnetic yoke as viewed in cross-section.

26. The current sensor apparatus according to claim 21 wherein the field interrupter is made of a magnetic substance.

27. The current sensor apparatus according to claim 21 wherein the magnetic sensor element is a fluxgate magnetic sensor element.

\* \* \* \* \*